(12) United States Patent
Gottesman

(10) Patent No.: US 11,836,573 B2
(45) Date of Patent: Dec. 5, 2023

(54) SYSTEMS AND METHODS FOR USE OF A MAXIMALLY SENSITIVE SET OF STATES TO IDENTIFY COHERENT ERRORS IN A QUANTUM SYSTEM

(71) Applicant: Keysight Technologies Canada Inc., Loveland, CO (US)

(72) Inventor: Daniel Gottesman, Waterloo (CA)

(73) Assignee: KEYSIGHT TECHNOLOGIES CANADA INC., Mississauga (CA)

( * ) Notice: Subject to any disclaimer, the term of this patent is extended or adjusted under 35 U.S.C. 154(b) by 466 days.

(21) Appl. No.: 17/179,270

(22) Filed: Feb. 18, 2021

(65) Prior Publication Data

US 2021/0264310 A1    Aug. 26, 2021

Related U.S. Application Data

(60) Provisional application No. 62/978,162, filed on Feb. 18, 2020.

(51) Int. Cl.
| | |
|---|---|
| G06F 11/00 | (2006.01) |
| G08C 25/00 | (2006.01) |
| H03M 13/00 | (2006.01) |
| G06N 10/00 | (2022.01) |
| G06F 17/18 | (2006.01) |
| G06N 10/70 | (2022.01) |

(52) U.S. Cl.
CPC .............. *G06N 10/00* (2019.01); *G06F 17/18* (2013.01); *G06N 10/70* (2022.01)

(58) Field of Classification Search
CPC ......... G06N 10/00; G06N 10/70; G06F 17/18
See application file for complete search history.

(56) References Cited

U.S. PATENT DOCUMENTS

| | | | |
|---|---|---|---|
| 10,031,791 B1 | 7/2018 | Wallman et al. | |
| 10,360,088 B2 | 7/2019 | Wallman et al. | |
| 2021/0192381 A1* | 6/2021 | Ijaz | ........................... G06N 3/08 |

* cited by examiner

*Primary Examiner* — Samir W Rizk

(57) ABSTRACT

For respective positive integer value n, performing an outer and inner procedures, for states sufficiently representing coherent-error in a quantum system. Inner procedure creates copies state entangling n-qudits using randomized compiling, and obtains measurements of n-qudits in a basis corresponding to f-states. An outcome bit string forms for the state from measurement. The outer procedure and the forming string repeats, obtaining outcome bit strings for each state. Error-rate is determined for each state using the outcome bit strings for the respective value n. The outer procedure through determining error-rate repeats for different n drawn from positive-integers, determines error-rate for each state for respective values n. For state-S, error-rate fits for each respective value-n of the state to a corresponding quadratic function, the error-rate as dependent variable and n as independent variable. Coefficient for the highest term in each quadratic function of each state to quantifies a parameter of the coherent-error.

22 Claims, 6 Drawing Sheets

SYSTEMS AND METHODS FOR USE OF A MAXIMALLY SENSITIVE SET OF STATES TO IDENTIFY COHERENT ERRORS IN A QUANTUM SYSTEM

CROSS-REFERENCE TO RELATED APPLICATION

This Application claims priority to U.S. Provisional Patent Application No. 62/978,162, entitled "Systems and Methods for Use of a Maximally Sensitive Set of States to Identify Coherent Errors in a Quantum System, filed Feb. 18, 2020, which is hereby incorporated by reference in its entirety.

TECHNICAL FIELD

The present disclosures relate generally to use of a maximally sensitive set of states to identify coherent errors in a quantum system.

BACKGROUND

As current technologies enters an era where experimental realizations of quantum computers are rapidly increasing in size and accuracy, the problem of characterizing errors in a quantum computer becomes more and more salient. On the one hand, whether the device is reliable enough to allow fault-tolerant software to operate, which in turn allows logical computations to be completed with negligible errors, must be known. Gottesman, D., 2010, "An introduction to quantum error correction and fault-tolerance quantum computing," Quantum Information Science and Its Contribution to Mathematics, Proceedings of Symposia in Applied Mathematics, 68, pg. 13. The level of error also helps determine the amount of overhead (e.g., extra qubits and extra gates) needed for fault tolerance. On the other hand, a good characterization of the errors in the system can provide guidance as to what is causing the errors and how to further reduce the error rates.

There are many different kinds of errors to consider. Even in the simplest case of independent Markovian noise on each qubit, there is an infinite variety of possible types of error. One conceptual distinction that is often made is between stochastic errors, which behave essentially probabilistically, and coherent errors, which can experience quantum interference to enhance or decrease the effect of the errors. Then there are many errors which include both types of error, for which the distinction between stochastic and coherent errors is not so clear.

A reason to make this distinction is because coherent errors, which constructively interfere with each other, can build up much faster than stochastic errors. As a simple example, consider the n-qubit state $|\psi z\rangle = |00 \ldots 0\rangle + |11 \ldots 1\rangle$. An example of a stochastic channel is one which does a Z (phase flip) on each qubit independently with probability p. Then for the state $|\psi z\rangle$, the probability of error when p is small is roughly pn. In contrast, an example coherent channel might do a phase rotation $|0\rangle |0\rangle$, $|1\rangle e^{i\theta}|1\rangle$. Now the probability of error for small $\theta$ is about $\theta^2 n^2$. Here, the probability of error is defined for this purpose to be the probability that a measurement projecting on the expected state $|\psi z\rangle$ gets a different result. For a single qubit, the two channels have comparable noise rates when $p=\theta^2$, but the coherent channel rapidly outpaces the incoherent one. Intuitively, the coherent errors allow the amplitudes of the error to add up, which are then squared via Born's rule to make probabilities, whereas for a stochastic error, the probability of error on different qubits adds up directly. Another way of understanding the distinction is to consider the relationship between gate fidelity and diamond norm. For some channels (e.g., stochastic channels) they can be similar, whereas for other channels (e.g., coherent channels) the gate fidelity can be the square of the diamond norm.

One consequence of this difference is that the threshold for fault-tolerant quantum computation to work could potentially be much worse for coherent errors than for stochastic errors. Aliferis et al., 2006, "Quantum accuracy threshold for catenated distance-3 codes," Quant. Int. Comp., 6, pg. 97. For instance, a fault-tolerant protocol which functions when $p<10^{-4}$ might instead require $\theta \leq 10^{-4}$, which translates to a single-qubit error probability of about $10^{-8}$! Now, knowing with certainty that this can happen in realistic situations is not plausible, only that existing threshold proofs can only guarantee that the system works for the lower error rate. It remains unclear whether it is actually possible for coherent errors in a fault-tolerant circuit to build up sufficiently close to the maximum rate to have such a big effect. It is difficult to do simulations of coherent errors, but there has been some work on this topic, and those simulations suggest that the size of the effect is modest, but perhaps not negligible. Darmawan et al., 2017, "Tenor-network simulations of the surface code under realistic noise," Phys. Rev. Lett., (119), pg. 050402; Bravyi et al., 2018, "Correcting coherent errors with surface codes," npj Quantum Information, 4(55), print. Nevertheless, it remains a possible source of concern for building large fault-tolerant quantum computers.

A number of solutions to coherent errors are known. One possibility is dynamical decoupling, which takes advantage of the fact that coherent errors are always the same to get them to cancel out. Viola et al., 1999, "Dynamical decoupling of open quantum systems," Phys. Rev. Lett., (82), pg. 2417. However, this approach does not work on stochastic errors. Another approach is randomized compiling, where the system is randomized periodically to prevent errors from building up coherently, effectively turning a coherent channel into a stochastic one. Wallman et al., 2016, "Noise tailoring for scalable quantum computation via randomized compiling," Phys. Rev. A, (94), pg. 052325. Both approaches involve extra gates or control pulses, so using them only if they are actually needed (both to save time and because the extra gates can potentially themselves be a source of errors) is comprehensible. The amount of overhead depends on the details of the gate implementations and circuits being performed. In some cases, the additional resources required by these techniques might be small or zero, but in other cases it could be more significant.

Therefore, it is useful to have ways to determine if the errors in a system are predominately coherent or mostly stochastic. For instance, one can do a full characterization of the channel and gates in some way, for instance via gate set tomography. Blume-Kohout et al., 2013, Robust, self-consistent, closed-form tomography of quantum logic gates on a trapped ion qubit," arXiv preprint, pg. 1310.4492. However, gate set tomography is quite costly and the need to choose a gauge can cause difficulties, whereas in many applications the desired gauge is given by knowledge of the physics of the system being studied. Another possibility is to measure the unitarity. Wallman et al., 2015, "Estimating the coherence of noise," New. J. Phys., (17), pg. 113020. The unitarity combined with randomized benchmarking can determine the coherent error rate averaged over states and gates, but cannot determine the coherent error on a single type of gate and certainly not on state preparation or measurement.

Another common heuristic approach to detect coherent errors in a particular gate is to simply repeat the gate a number of times in sequence. This approach will detect many cases of coherent errors. For instance, consistent over-rotation will accumulate coherently in this circuit. However, this approach does not detect all coherent errors. For instance, consider a rotation about an axis which is slightly wrong. Repeating the gate will make a larger rotation about the wrong axis, but will not amplify the error to allow it to build up rapidly even though a different sequence of gates could potentially cause a coherent build-up of this error.

A separate challenge with characterizing errors is that any serious candidate technology for building large quantum computers will have rather low error rates. This means that a lot of data and many runs of an experiment are necessary to even distinguish the error rate from zero, and many more are needed to find out additional information about the nature of the errors. In the case of stochastic errors, nothing can really be done about this. When the errors are largely coherent, however, the potential rapid rise in the error rate now becomes an advantage, allowing us to use fewer qubits and gates to identify the error.

Unfortunately, any given n-qubit state will not necessarily experience quadratic accumulation of errors for the particular channel in the system. Therefore, it makes sense to ask what is a minimal set of states for which at least one will show a quadratic rise in the error rate, no matter what coherent channel it is subjected to.

The information disclosed in this background section is only for enhancement of understanding of the general background of the invention and should not be taken as an acknowledgement or any form of suggestion that this information forms the prior art already known to a person skilled in the art.

SUMMARY

The present disclosure addresses the above-mentioned shortcomings by introducing a computer system for identifying coherent error or evolution of interests of a quantum system.

Coherent errors in a quantum system can, in principle, build up much more rapidly than incoherent errors, accumulating as the square of the number of qubits in the system rather than linearly. The present disclosure illustrates that only channels dominated by a unitary rotation can display such behavior. A maximally sensitive set of states is a set such that if a channel is capable of quadratic error scaling, then it is present for at least one sequence of states in the set. The present disclosure shows that the GHZ states in the X, Y, and Z bases form a maximally sensitive set of states, allowing a straightforward test to identify coherent errors in a system. This allows us to identify coherent errors in gates and measurements to within a constant fraction of the maximum possible sensitivity to such errors. A related protocol with simpler circuits but less sensitivity can also be used to test for coherent errors in state preparation or if the noise in a particular circuit is accumulating coherently or not.

One aspect of the present disclosure provides a computer system for identifying coherent error or evolution of interest. The computer system includes at least one processor, and a memory storing at least one program for execution by the at least one processor. The at least one program includes instructions for, for a respective value for n that is a positive integer, performing an outer procedure. The outer procedure includes, for each respective state in a plurality of states, performing an inner procedure. Furthermore, the plurality of states is sufficient to represent all coherent error or evolution of interest in a quantum system. Moreover, the inner procedure includes creating a copy of the respective state using randomized compiling. In addition, the respective state entangles n qudits of the quantum system. The inner procedure further includes obtaining one or more measurements of the n qudits in a measurement basis that corresponds to the plurality of states. Furthermore, the at least one program includes instructions for forming a respective outcome bit string for the respective state from each measurement of each qudit in the n qudits. Accordingly, the at least one program includes instructions for repeating the performing of the outer procedure and the forming the respective outcome bit string a number of times (e.g. 10 times, a hundred times, a thousand times, a hundred thousand times or more). In this way, this repeating obtains a corresponding plurality of outcome bit strings for each respective state in the plurality of states. The at least one program further includes instructions for determining an error rate for each respective state using the corresponding plurality of outcome bit strings for the respective state for the respective value n. Additionally, the at least one program includes instructions for repeating the performing the outer procedure through the determining the error rate for each different n drawn from a plurality of positive integers. Rom this, the repeating determines an error rate for each respective state for each respective value n in a plurality of values n. Furthermore, the at least one programs includes instructions for, for each respective state S in the plurality of states, fitting the error rate for each respective value n in a plurality of values n obtained for the respective state to a corresponding quadratic function in which the error rate is the dependent variable and n is the independent variable. The at least one program further includes instructions for using at least the coefficient for the highest term in each corresponding quadratic function of each respective state to quantify a parameter of the coherent error or evolution of interest.

In some embodiments, the coherent error or evolution of interest is coherent error in the noise channel for a single-qudit gate F.

In some embodiments, the plurality of qudits is a plurality of qubits. Moreover, F is a single-qubit Clifford group gate.

In some embodiments, the inner procedure further includes, between the creating and the obtaining of the inner procedure, first applying $PF^\dagger Q$ to each qudit in the n qudits, in which P is a random Pauli gate, F is perfect unitary gate, $F^\dagger$ is F twirled, and Q is $FPF^\dagger$, and second applying F to each qudit in the n qudits.

In some embodiments, the randomized compiling or twirling of any gates disclosed in the present application is performed using randomized compiling methods, such as those disclosed in U.S. Pat. No. 10,031,791, entitled "System and Methods for Quantum Computation Using Random Compiling," issued Jul. 24, 2018; and U.S. Pat. No. 10,360,088, entitled "Randomized Coupling for Quantum Computation," issued Jul. 23, 2019, each of which is hereby incorporated by reference in its entirety.

In some embodiments, the plurality of states is a maximally sensitive set of states.

In some embodiments, the maximally sensitive set of states consists of $|\psi_{n,x}\rangle$, $|\psi_{n,y}\rangle$, and $|\psi_{n,z}\rangle$, and a measurement basis that corresponds to the plurality of states is the Z basis when the respective state is of $|\psi_{n,X}\rangle$ or $|\psi_{n,Y}\rangle$ and the X basis when the respective state is $|\psi_{n,Z}\rangle$.

In some embodiments, the corresponding quadratic function has the form $a_S n^2 + b_S n + c$ is a measured error rate, in which a, b, and c are fitted coefficients.

In some embodiments, the plurality of qudits is a plurality of qubits. Moreover, the coherent error or evolution of interest is coherent error in the noise channel for a single-qudit gate F. Additionally, the parameter of the coherent error is $\theta^2 = a_X + a_Y + a_Z$. Furthermore, the plurality of states is a maximally sensitive set of states consisting of $|\psi_{n,X}\rangle$, $|\psi_{n,Y}\rangle$, and $|\psi_{n,Z}\rangle$, $a_X$ is the a coefficient for the corresponding quadratic function for $|\psi_{n,X}\rangle$, $a_Y$ is the a coefficient for the corresponding quadratic function for $|\psi_{n,Y}\rangle$, and $a_Z$ is the a coefficient for the corresponding quadratic function for $|\psi_{n,Z}\rangle$.

In some embodiments, the at least one program further includes instructions calculating $v_S^2 = a_P / \theta^2$, wherein $a_P$ is one of $a_X$, $a_Y$, and $a_Z$.

In some embodiments, the coherent error or evolution of interest is coherent error in measurement using the quantum system.

In some embodiments, the plurality of qudits is a plurality of qubits. Furthermore, the plurality of states consists of $|\psi_{n,X}\rangle$ and $|\psi_{n,Y}\rangle$. Additionally, the measurement basis is the Z basis.

In some embodiments, the corresponding quadratic function has the form $aSn^2 + bSn + c$ is measured error rate, in which a, b, and c are fitted coefficients. Additionally, the parameter of the coherent error is $\theta^2 = a_X + a_Y$. Further, $a_X$ is the a coefficient for the corresponding quadratic function for $|\psi_{n,X}\rangle$, and $a_Y$ is the a coefficient for the corresponding quadratic function for $|\psi_{n,Y}\rangle$.

In some embodiments, the mat least one program further includes instructions for calculating $v_S^2 = a_P / \theta^2$, wherein $a_P$ is one of $a_X$ and $a_Y$.

In some embodiments, the obtaining the one or more measurements includes obtaining a separate measurement of each qudit in the n qudits in the measurement basis that corresponds to the plurality of states.

In some embodiments, the creating the copy of the respective state entangles all n qudits of the quantum system at the same time.

In some embodiments, the plurality of qudits consists of two qudits and the creating the copy of the respective state using randomized compiling entangles the plurality of qudits sequentially after resetting a first qudit in the pair of qudits.

Yet another aspect of the present disclosure is directed to providing a method for identifying coherent error or evolution of interest. The method is performed at a computer system. The computer system including at least one processor and a memory storing at least one program for execution by the at least one processor. The method includes, for a respective value for n that is a positive integer, performing an outer procedure. The outer procedure includes, for each respective state in a plurality of states, in which the plurality of states is sufficient to represent all coherent error or evolution of interest in a quantum system, performing an inner procedure. The inner procedure includes creating a copy of the respective state using randomized compiling, in which the respective state entangles n qudits of the quantum system. The inner procedure further includes obtaining one or measurements of the n qudits in a measurement basis that corresponds to the plurality of states. The method further includes forming a respective outcome bit string for the respective state from each measurement of each qudit in the n qudits. Additionally, the method includes repeating the preforming the outer procedure (e.g. 10 times, a hundred times, a thousand times, a hundred thousand times or more) and the forming the respective outcome bit string a number of times, thus obtaining a corresponding plurality of outcome bit strings for each respective state in the plurality of states. Moreover, the method includes determining an error rate for each respective state using the corresponding plurality of outcome bit strings for the respective state for the respective value n. From this, the method includes repeating the performing the outer procedure through the determining the error rate for each different n drawn from a plurality of positive integers, thus determining an error rate for each respective state for each respective value n in a plurality of values n. Additionally, the method includes, for each respective state S in the plurality of states, fitting the error rate for each respective value n in a plurality of values n obtained for the respective state to a corresponding quadratic function in which the error rate is the dependent variable and n is the independent variable. The method further includes using at least the coefficient for the highest term in each corresponding quadratic function of each respective state to quantify a parameter of the coherent error or evolution of interest.

Yet another aspect of the present disclosure is directed to providing a non-transitory computer readable storage medium storing one or more programs. The one or more programs includes instructions, which when executed by a computer system with one or more processors, cause the computer system to perform a method. The method includes, for a respective value for n that is a positive integer, performing an outer procedure. The outer procedure includes, for each respective state in a plurality of states, in which the plurality of states is sufficient to represent all coherent error or evolution of interest in a quantum system. performing an inner procedure. The inner procedure includes creating a copy of the respective state using randomized compiling, in which the respective state entangles n qudits of the quantum system. The inner procedure further includes obtaining one or more measurements of the n qudits in a measurement basis that corresponds to the plurality of states. The method further includes forming a respective outcome bit string for the respective state from each measurement of each qudit in the n qudits. The method further includes repeating (e.g. 10 times, a hundred times, a thousand times, a hundred thousand times or more) the performing the outer procedure and the forming the respective outcome bit string a number of times, thus obtaining a corresponding plurality of outcome bit strings for each respective state in the plurality of states. The method further includes determining an error rate for each respective state using the corresponding plurality of outcome bit strings for the respective state for the respective value n. From this, the method includes repeating the performing the outer procedure through the determining the error rate for each different n drawn from a plurality of positive integers, thus determining an error rate for each respective state for each respective value n in a plurality of values n. Additionally, the method includes, for each respective state S in the plurality of states, fitting the error rate for each respective value n in a plurality of values n obtained for the respective state to a corresponding quadratic function in which the error rate is the dependent variable and n is the independent variable. Furthermore, the method includes using at least the coefficient for the highest term in each corresponding quadratic function of each respective state to quantify a parameter of the coherent error or evolution of interest.

Yet another aspect of the present disclosure is directed to providing a computer system for identifying coherent error or evolution of interest. The computer system includes at least one processor, and a memory storing at least one program for execution by the at least one processor. The at least one program includes instructions for sending a first set of gates to a first qudit of a quantum system. The first set of gates prepare the first qubit in a predetermined basis state, and measure the first qudit. Moreover, the gates in the first set of gates for preparing the first qudit in the predetermined basis state are twirled, and the gates in the first set of gates that measure the first qudit are twirled. The at least one program further includes instructions for repeating repeating the sending the first set of gates a plurality of times, thus determining a probability ($P_o^t$) of a first predetermined output. The at least one program further includes instructions for sending a second set of gates to the first qudit. Furthermore, the second set of gates prepare the first qudit, and measure the first qudit, such that only the gates in the second set of gates for measurement of the first qudit are twirled. From this, the at least one program further includes instructions for repeating the sending the second set of gate a plurality of times, thus determining a probability $P_o$ of a second predetermined output. Moreover, the at least one program further includes instructions for sending a third set of gates to the first qudit. The third set of gates: prepare the first qudit; perform a set of n rotations using $w_X=1$ and $w_Y=0$, in which n is a positive integer; and measure the first qudit, such that the gates in the third set of gates for preparing the first qudit are twirled, the gates for measuring the first qudit are twirled, and the gates for performing the set of n rotations are not twirled. Furthermore, the at least one program further includes instructions for repeating the sending the third set of gates a plurality of times, thus determining a probability ($P_{n,X}^t$) of a third predetermined output. The at least one program further includes instructions for sending a fourth set of gates to the first qudit. The fourth set of gates prepare the first qudit. Moreover, the fourth set of gates perform a set of n rotations using $w_X=0$ and $w_Y=1$, wherein n is a positive integer. In addition, the fourth set of gates measure the first qudit, in which the gates in the fourth set of gates for preparing the first qudit are twirled, the gates for measuring the first qudit are twirled, and the gates for performing the set of n rotations are not twirled. The at least one program further includes instructions for repeating the sending the fourth set of gates a plurality of times, thus determining a probability ($P_{n,Y}^t$) of a fourth predetermined output. Moreover, the at least one program further includes instructions for sending a fifth set of gates to the first qudit. The fifth set of gates prepare the first qudit. The fifth set of gates also perform a set of n rotations using $w_X=1$ and $w_Y=0$. Moreover, the fifth set of gates measure the first qudit, in which gates in the fifth set of gates for preforming the measurement are twirled and the remaining gates in the fifth set of gates are not twirled. The at least one program further includes instructions for repeating the sending the fifth set of gates a plurality of times, thus determining a probability ($P_{n,X}^t$) of a fifth predetermined output. Furthermore, the at least one program further includes instructions for sending a sixth set of gates to the first qudit. The sixth set of gates prepare the first qudit. The sixth set of gates further perform a set of n rotations using $w_X=0$ and $w_Y=1$. Moreover, the sixth set of gates measure the first qudit, in which the gates in the sixth set of gates for preforming the measurement are twirled and the remaining gates in the sixth set of gates are not twirled. The at least one program further includes instructions for repeating the sending the sixth set of gates a plurality of times, thus determining a probability ($P_{n,Y}$) of a sixth predetermined output. Furthermore, the at least one program further includes instructions for using the probabilities: $P_o^t$; $P_o$; $P_{n,X}^t$; $P_{n,Y}^t$; $P_{n,X}$; and $P_{n,Y}$ to determine a coherent error or evolution of the state preparation of the first qudit.

In some embodiments, the first qudit is a first qubit.

In some embodiments, in the sending the first set of gates, the gates in the first set of gates for preparing the first qudit into the predetermined basis state are twirled by randomized compiling, and the gates in the first set of gates that measure the first qudit are twirled by randomized compiling. Moreover, in the sending the second set of gates, the gates in the second set of gates for measurement of the first qudit are twirled by randomized compiling. Furthermore, in the sending the third set of gates, the gates in the third set of gates for preparing the first qudit and the gates for measurement are twirled by randomized compiling. Additionally, in the sending the fourth set of gates, the gates in the fourth set of gates for preparing the first qudit and the gates for measuring are twirled by randomized compiling. Furthermore, in the sending the fifth set of gates, the gates for measurement are twirled. Finally, in the sending the sixth set of gates, the gates for measurement are twirled.

Yet another aspect of the present disclosure is directed to providing a computer system for determining whether a qudit location in a quantum system is contributing to a coherent noise of the quantum system. The computer system includes at least one processor, and a memory storing at least one program for execution by the at least one processor. The at least one program includes instructions for running circuit $Q^{j,T}$ with randomized compiling for both qudit location j and a plurality of qudit locations T within the quantum system. Qudit location j and the plurality of qudit locations T collectively consist of the qudit locations within the quantum system that are susceptible to coherent noise, with an output distribution $X^{j,T}$. The at least one program includes instructions for running the circuit $Q^T$, in which the qudit location j is not twirled but the plurality of qudit locations T are twirled, with output distribution $X^T$. Moreover, the at least one program includes instructions for computing the fidelity $F^{j,T}$ between $X^T$ and $X^{j,T}$, thus setting a baseline of comparison for a difference twirling makes on the noise in qudit location j in isolation. Furthermore, the at least one program includes instructions for running the circuit $Q^j$ using randomized compiling on location j but on no other qudit within the quantum system with output distribution $X^j$. Also, the at least one program includes instructions for computing the fidelity $F^j$ between $X^j$ and $X^T$. The at least one program further includes instructions for running the circuit Q without any randomized compiling with output distribution X. Additionally, the at least one program includes instructions for computing the fidelity F between X and $X^T$. Furthermore, the at least one program includes instructions for determining, when $F^j-F$ is greater than $1-F^{j,T}$, that qudit location j is contributing coherent noise to the quantum system.

DETAILED DESCRIPTION

Figure 1:
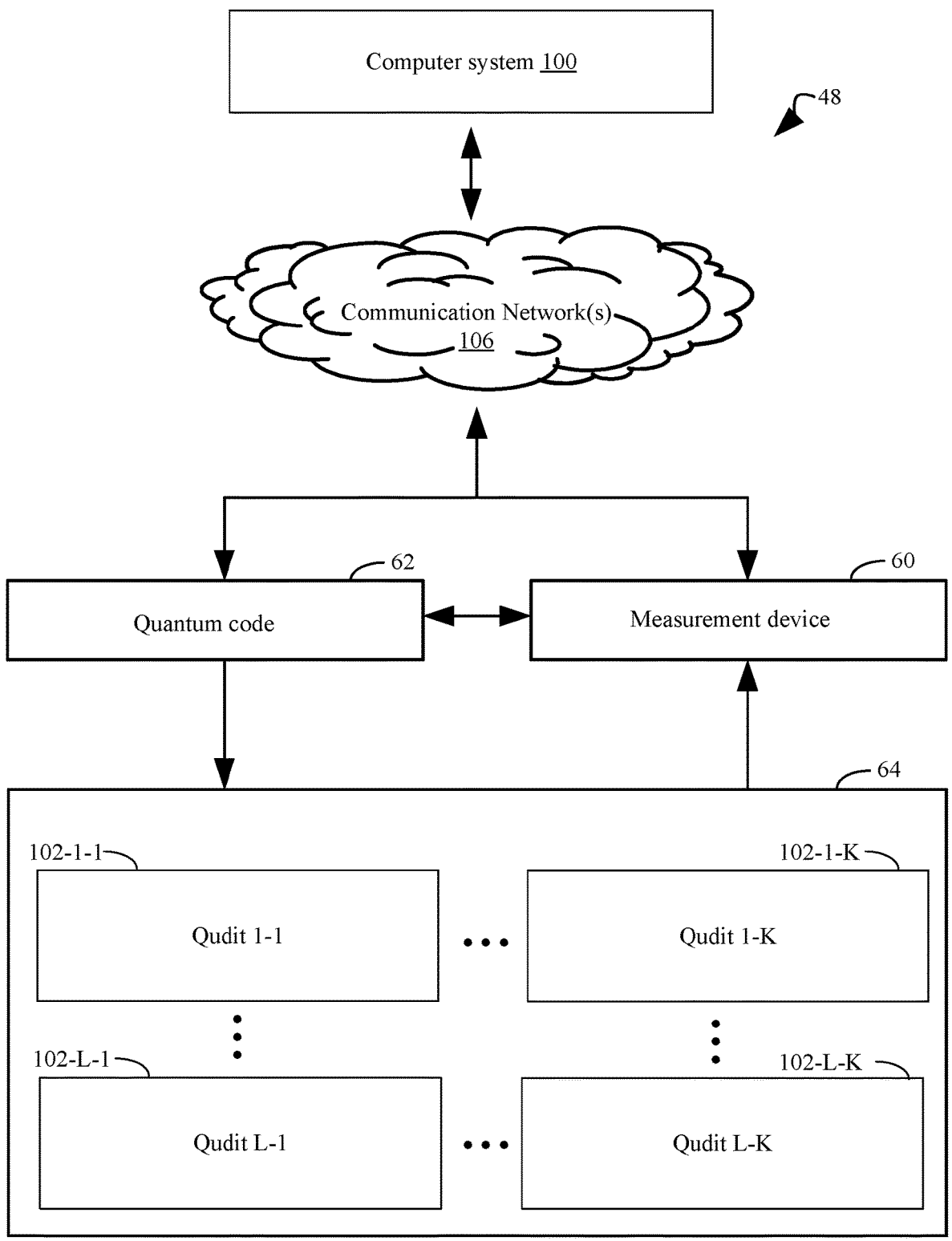
FIG. 1 is a schematic diagram showing aspects of an example system that includes a digital computer system for identifying coherent error or evolution of interest of a quantum computers system, and the quantum computer system, in accordance with an embodiment of the present disclosure.

The present disclosure provides characterization of the coherent part of a channel, and determination for any given channel the maximum amount of quadratic error scaling possible for that channel. The present disclosure also illustrates that the set of GHZ states is a maximally sensitive set of states and discloses how to implement simple protocols that are maximally sensitive to coherent errors. Furthermore, the present disclosure describes quadratic accumulation and maximally sensitive sets of states for qudits. Moreover, the present disclosure describes what happens when the channel is not the same on all qubits. Additionally, the present disclosure determines how to apply randomized compiling to eliminate coherent noise in the gates not being tested. Moreover, the present disclosure determines how to use the protocol to measure coherent errors in gates and in measurements. The present disclosure develops definitions and formulas to study more general circuits, and provides a protocol for testing for coherent errors in state preparation.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first subject could be termed a second subject, and, similarly, a second subject could be termed a first subject, without departing from the scope of the present disclosure. The first subject and the second subject are both subjects, but they are not the same subject.

The terminology used in the present disclosure is for the purpose of describing particular embodiments only and is not intended to be limiting of the invention. As used in the description of the invention and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

FIG. 1 illustrates a computer system topology 48 for identifying coherent error or evolution of interest for a quantum system 64. In typical embodiments, the topology includes a computer system 100 (e.g., a digital computer system) that is in electronic communication with a quantum computer system 64 (interchangeably referred to herein as a "quantum system"). The quantum system includes a plurality of qubits 102 or a plurality of qudits. In some embodiments, the electronic communication between the computer system 100 and the quantum computer system 64 is over a communication network 106. In some embodiments, the computer system 100 applies suitable quantum codes 62 to the quantum system 64. In some embodiments, the computer system 100 determines information about a state of the qubits or qudits 102 of the quantum system 64 using one or more measurement devices 60.

Figure 2:
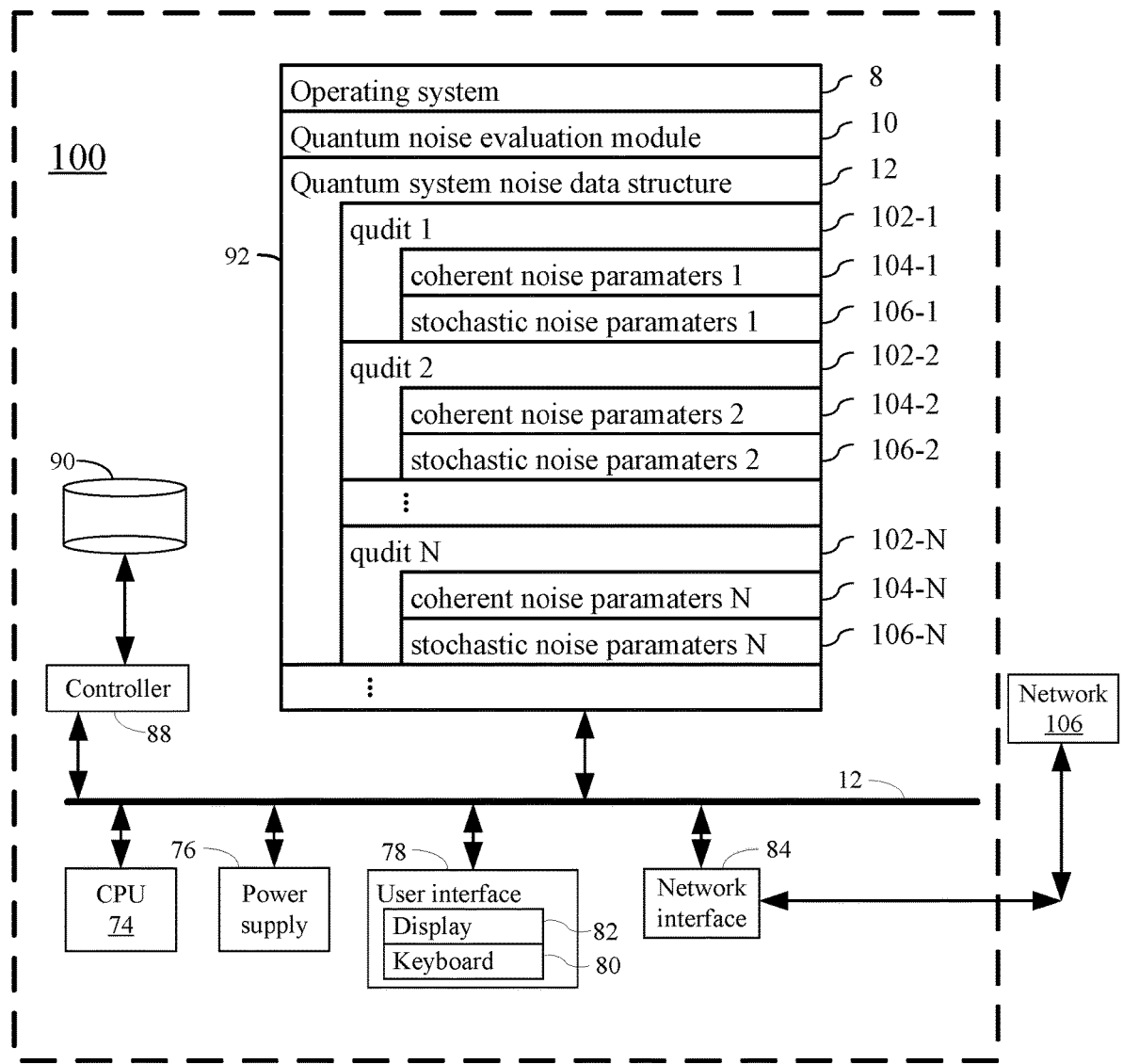
FIG. 2 is a schematic diagram of a digital computer system for identifying coherent error or evolution of interest of a quantum computer system, in accordance with an embodiment of the present disclosure.
Figure 3:
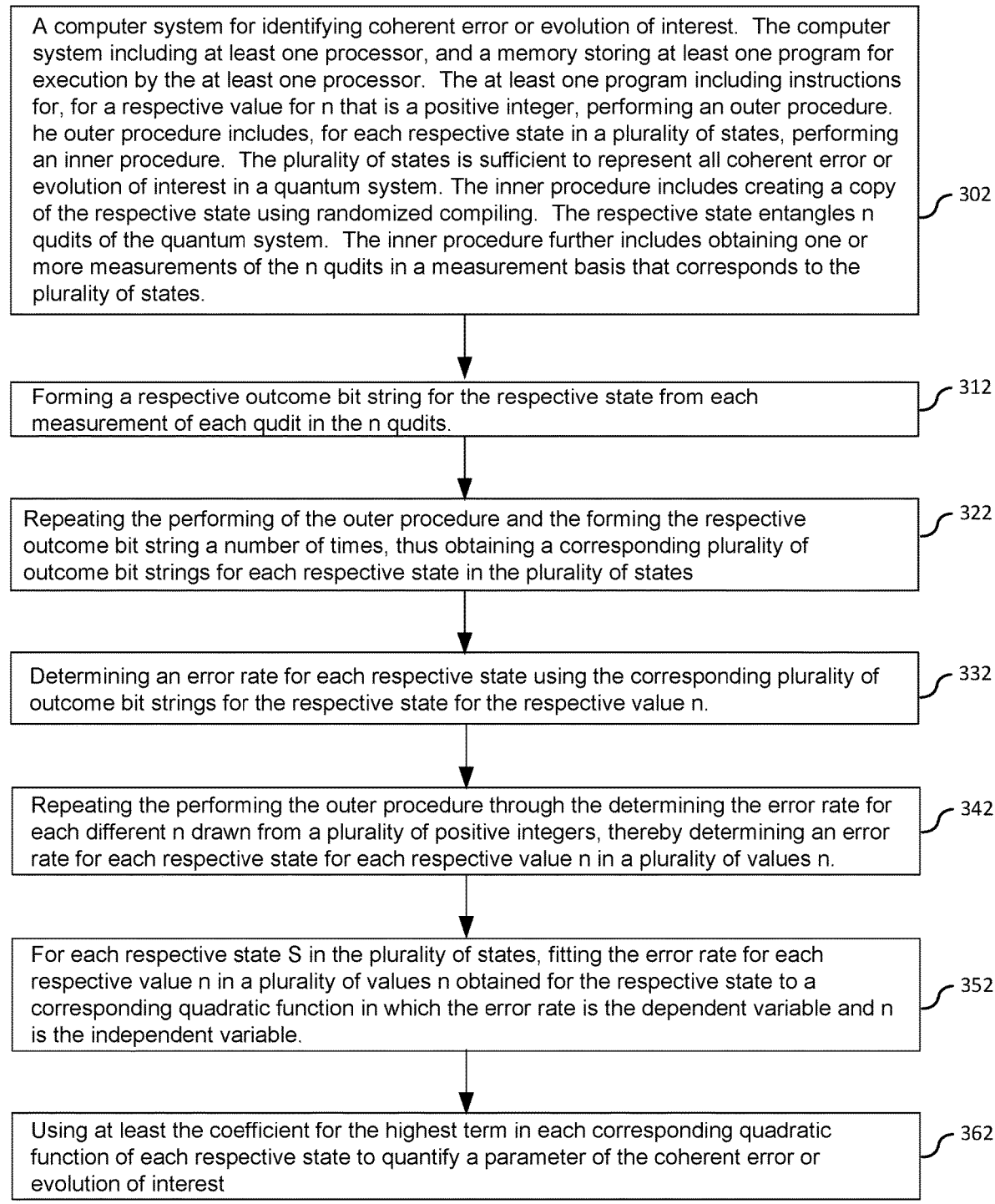
FIG. 3 illustrates a flow chart showing an example quantum computational process, in accordance with an embodiment of the present disclosure.

Turning to FIG. 2 with the foregoing in mind, a computer system 100 comprises one or more processing units (CPUs) 74, a network or other communications interface 84, optionally, a user interface 78 (e.g., including a display 82 and keyboard 80 or other form of input device), a memory 92 (e.g., random access memory), one or more magnetic disk storage and/or persistent devices 90 optionally accessed by one or more controllers 88, one or more communication busses 12 for interconnecting the aforementioned components, and a power supply 76 for powering the aforementioned components. Data in memory 92 can be seamlessly shared with non-volatile memory 90 using known computing techniques such as caching. Memory 92 and/or memory 90 can include mass storage that is remotely located with respect to the central processing unit(s) 74. In other words, some data stored in memory 92 and/or memory 90 may in fact be hosted on computers that are external to analysis computer system 100 but that can be electronically accessed by the analysis computer system over an Internet, intranet, or other form of network or electronic cable using network interface 84.

The memory 92 of the computer system 100 stores:
- an operating system 8 that includes procedures for handling various basic system services;
- a quantum noise evaluation module 10 for identifying coherent error or evolution interest of a quantum computer including a plurality of qudits 102, or, in some embodiments, a plurality of qubits; and
- a quantum system noise data structure 12 that describes a plurality of coherent noise parameters 104 and a plurality of stochastic noise parameters 106 for each respective qudit 102 in the plurality of qudits.

In some implementations, one or more of the above identified data elements or modules of the computer system 100 are stored in one or more of the previously disclosed memory devices, and correspond to a set of instructions for performing a function described above. The above identified data, modules or programs (e.g., sets of instructions) need not be implemented as separate software programs, procedures or modules, and thus various subsets of these modules may be combined or otherwise re-arranged in various implementations. In some implementations, the memory 92 and/or 90 optionally stores a subset of the modules and data structures identified above. Furthermore, in some embodiments the memory 92 and/or 90 stores additional modules and data structures not described above.

Now that a system for identifying coherent error or evolution of interest for a quantum system 64 have been described, methods for identifying coherent error or evolution of interest for a quantum system are disclosed with reference to FIGS. 3 through 6.

In present disclosure, a set of three states is determined, the GHZ states in the X, Y, and Z bases, which have this property. For any channel C applied to n qubits, the infidelity between at least one of these three states and itself with C applied on all n qubits is at least a constant fraction of the maximum achievable infidelity for any state. Therefore, by creating these three states in different sizes and looking for quadratic scaling of the error rate, the present disclosure identifies the presence of coherent errors. In fact, based on this set of measurements, the present disclosure determines exactly what the coherent part of the channel is. Accordingly, the present disclosure illustrates the coherent part is always a unitary rotation, so the characterization consists of an axis of rotation and an angle. It turns out that this criterion is also sufficient to predict the possibility of coherent accumulation of errors in other contexts as well.

In a real system, the gates used to the create the GHZ states will be imperfect, and coherent errors in the encoding circuits could be confused with coherent errors in the channel. A solution to this is to use randomized compiling on only part of the circuit, the encoding part. This solution converts any errors in the encoding part of the circuit into stochastic errors, leaving only coherent errors in the channel desirable to measure. This also enables measuring coherent errors in gates and measurements rather than only in a straightforward near-identity channel. To make the randomized compiling work, however, one must assume that an ability to perform high-fidelity Pauli gates, with error rates low enough that they are negligible for the desirable measurements. This is not an unreasonable assumption in many cases, since Pauli gates are simple single-qubit gates, but may not be always applicable in a system where all gates have a similar low error rate. Furthermore, to measure coherence in a fully universal set of gates, an additional gate or gates such as the $\pi/4$ phase rotation is essentially noiseless.

State preparation needs to be handled differently, since it cannot exhibit quadratic accumulation of errors with other state preparations, but can do so in conjunction with coherent errors in other gates. This requires a formalism to discuss quadratic accumulation in more general circuits, which results in an alternative protocol for testing for coherent errors in state preparations as well as other circuit elements. Compared to the protocol based on a maximally sensitive set of states, this alternative protocol is simpler but less sensitive. One intriguing aspect of this protocol is that it can be adapted to measure whether noise in a specific gate or other circuit is contributing to coherent accumulation of error in a particular circuit. This might be helpful both theoretically for understanding the role of coherent errors in specific protocols and experimentally for identifying which coherent errors are most important to deal with for the desired application of the quantum computer.

An aspect of the present disclosure is quite similar to the technique and results of others, but the present disclosure is concerned with the worst-case behavior of channels, whereas others are concerned with the behavior of channels averaged over inputs. Carnigan-Dugas et al., 2019, "A polar decomposition for quantum channels (with applications to bounding error propagation in quantum circuits)," Quantum, (3), pg. 173. This is an important difference because many of the results of other techniques fail when the worst-case behavior is considered instead. Carnigan-Dugas et al., (2019). Thus, it is significant that the leading Kraus approximation employed in this other technique and the present disclosure continues to work when studying a channel's potential for quadratic error accumulation in the worst case, even though it does not apply to other worst-case properties of the channel.

Now that a general overview of various capabilities of the present disclosure have been described, systems and methods for conducting and evaluating the maximally sensitive sets of states are disclosed below.

Example 1: The Coherent and Incoherent Parts of a Channel

The present disclosure considers a case with perfect quantum gates, and the only source of noise is through a quantum channel. In particular, the protocol will include creating a particular state from the maximally sensitive set, followed by a quantum channel on every qubit, and then making a measurement. Initially, the present disclosure considers a multi-qubit measurement, in particular, a projection on the original state create. Later, the present disclosure illustrates how to use single-qubit measurements instead. The gates involved in creating and measuring the states are perfect. Moreover, the present disclosure assumes that the channel on each qubit is independent, and can be represented in Kraus form:

$$C(\rho) = \sum_k A_k \rho A_k^\dagger, \qquad (1)$$

with $\Sigma_k A_k^\dagger A_k = I$. The Kraus operators are not unique, but some choices are better than others. By using the Choi-Jamiolkowski isomorphism and diagonalizing the density matrix, one may choose a canonical set of Kraus operators, although even this might not be unique if the eigenvalues of the Choi matrix are degenerate. In particular, in the limit of interest (e.g., when the channel is close to the identity) the leading Kraus operator $A_0$ is large and close to I and all other Kraus operators are small. In this case, many properties of the channel are determined by just $A_0$, allowing us to make a leading Kraus approximation. Carnignan-Dugas et al., (2019).

Consider: For a given channel C, can it display quadratic error accumulation or not? In order for this to be a well-defined question, one must work in a particular limit. First, one must look at different values of n. For low n there will be some transient behavior. For instance, the exact behavior could be of the form $an^2+bn$. Therefore, taking the limit of large n is desirable. However, if the infidelity to the identity gets large, O(1), it will necessarily start to saturate and the $n^2$ scaling will disappear. For a fixed channel, this will always happen for large enough n. Therefore, having a limit where n is large but $n^2 r$ is small, where r is the infidelity of a single use of the channel, is desirable. This means taking a family of channels $C_r$ instead of a fixed channel. Now, consider the leading order behavior in r. The coefficient of r is a function of n, and the channel displays quadratic accumulation if it is a quadratic function. More precisely:

Definition (1): Let $C_r$ be an analytic family of quantum channels mapping a single d-dimensional qudit to a qudit, parametrized so that the worst-case infidelity between $C_r$ and I is r. For fixed r and n, let $$F(n, r) = \min_{|\psi\rangle} \langle \psi | C_r^{\otimes n}(|\psi\rangle\langle\psi|)|\psi\rangle, \qquad (2)$$

where $|\psi\rangle$ runs over all n-qudit pure states. By assumption, $F(1,r)=1-r$. Let $G(n)=\lim_{r\to 0}[1-F(n,r)]/r$ if the limit exists and let $G(n)=\Theta(n^a)$ for large n. Accordingly, $C_r$ has order a accumulation. In particular, if a=1, $C_r$ has linear accumulation and if a=2, $C_r$ has quadratic accumulation.

While in principle this definition allows for accumulation by any polynomial, in fact, only linear and quadratic accumulation are possible. Which one applies to a channel can be determined by looking at the leading Kraus operator $A_0$:

Theorem 1: Let $C_r$ be a family of quantum channels as above, and suppose that $C_r$ has order a accumulation and d=2 (i.e., working with qubits). Then a=1 or a=2. Moreover, given two such families of channels $C_r$ and $C_r'$ with the same leading Kraus approximation $A_0$ for all r, then $C_r$ and $C_r'$ have the same order accumulation.

Proof: First, note that $a\geq 1$ always, since by considering a product state $|\phi\rangle^{\otimes n}$, determines $$F(n, r) \leq \left(\min_{|\phi\rangle}\langle\phi|C_r(|\phi\rangle\langle\phi|)|\phi\rangle\right)^n = (1-r)^n = 1-nr+O(r^2). \qquad (3)$$

Thus, $G(n)\geq n$, so $a\geq 1$.

Now consider the action of n copies of the full channel on the state:

$$C_r^{\otimes n}(\rho) = \sum_{k_1,\ldots,k_n} \left(\bigotimes_{i=1}^n A_{k_i}\right)\rho\left(\bigotimes_{i=1}^n A_{k_i}^\dagger\right). \qquad (4)$$

Here, the dependence on r of the right-hand side has been suppressed to simplify notation. The next step is to make a leading Kraus approximation, enabled by the following lemma, which is described in more detail infra.

Lemma 1. When $\{C_r\}$ is an analytic family of channels such that the worst-case fidelity between $C_r$ and I is r, then there is a choice of Kraus operators $\{A_k\}$ for $C_r$ such that $\|A_k\|_\infty = O(\sqrt{r})$ for $k\neq 0$.

Therefore, the only terms that can contribute to first order in r are those with at most one non-zero $k_i$:

$$C_r^{\otimes n}(\rho) = A_0^{\otimes n}\rho(A_0^\dagger)^{\otimes n} + \qquad (5)$$

$$\sum_{i=1}^n \sum_{k\neq 0}(A_0^{\otimes i-1}\otimes A_k \otimes A_0^{\otimes n-i})\rho((A_0^\dagger)^{\otimes i-1}\otimes A_k^\dagger \otimes (A_0^\dagger)^{\otimes n-i}) + O(r^2)$$

$$= A_0^{\otimes n}\rho(A_0^\dagger)^{\otimes n} + O(nr) + O(r^2). \qquad (6)$$

When determining G(n), the last $O(r^2)$ term disappears. The second term $O(nr)$ contributes a term to G that is at most linear in n. This means that the order of accumulation is greater than 1 if and only if the first term is $Q(n^a r)$ for a > 1 and that the order depends only on $A_0$.

Now, consider the effect of the first term when the input $\rho=|\psi\rangle\langle\psi|$ is a pure state:

$$\langle\psi|A_0^{\otimes n}|\psi\rangle\langle\psi|(A_0^\dagger)^{\otimes n}|\psi\rangle = |\langle\psi|A_0^{\otimes n}|\psi\rangle|^2. \qquad (7)$$

Using the singular value decomposition, $A_0=W\tilde{D}V$, where $\tilde{D}$ is real and diagonal and W and V are unitary. Setting $U=WV$, $D=V^\dagger\tilde{D}V$, this can be rewritten as:

$$A_0 = UD \qquad (8)$$

$$U = \cos\theta I + i\sin\theta \vec{v}\cdot\vec{\sigma} \qquad (9)$$

$$D = (1-p)I + \Delta\vec{w}\cdot\vec{\sigma}. \qquad (10)$$

Here, $\vec{\sigma}=(X,Y,Z)$ is the vector of Pauli matrices, $$X = \begin{pmatrix} 0 & 1 \\ 1 & 0 \end{pmatrix}, Y = \begin{pmatrix} 0 & -i \\ i & 0 \end{pmatrix}, Z = \begin{pmatrix} 1 & 0 \\ 0 & -1 \end{pmatrix}, \qquad (11)$$

$\vec{v}$ and $\vec{w}$ are real norm-1 dimension 3 vectors, and $\theta$, p, and $\Delta$ are real. Since $A_0^\dagger A_0 \leq I$, this yields $p\geq|\Delta|$ and $p+\Delta\leq 1$. Since $A_0$ is close to I, $\theta$, p, and $\Delta$ are all small. To leading order in these quantities for each Pauli, yield:

$$A_0 = (1-p-\theta^2/2)I + (i\theta\vec{v} + \Delta\vec{w})\cdot\vec{\sigma}. \qquad (12)$$

Since $p\geq|\Delta|$, the term $\Delta\theta$ is automatically o(p).

Now, the present disclosure determines the scaling of r with $\theta$, p, and $\Delta$ for $A_0$. Let $|\psi\rangle=\alpha|0\rangle+\beta|1\rangle$, choosing to work in the basis where U is diagonal and D has no Y component, so $\vec{v}=(0, 0, 1)$ and $\vec{w}=(w_X, 0, w_Z)$. Then $$\langle\psi|A_0|\psi\rangle = 1-p-\theta^2/2+(i\theta+\Delta w_Z)(|\alpha|^2-|\beta|^2)+\Delta w_X(\alpha^*\beta+\beta^*\alpha) \qquad (13)$$

and $$1-|\langle\psi|A_0|\psi\rangle|^2 = 2p+\theta^2-2\Delta w_Z(|\alpha|^2-|\beta|^2)-2\Delta w_X(\alpha^*\beta+\beta^*\alpha)-\theta^2(|\alpha|^2-|\beta|^2)^2. \qquad (14)$$

In particular, this illustrates that at least one of p and $\theta^2$ must be $\Theta(r)$. That is, if $\Delta$ is $\Theta(r)$, p must be too since $|\Delta|\leq p$.

Now, consider the n-qubit case. To leading order, $$A_0^{\otimes n} = (1-np-n\theta^2/2)I + (i\theta\vec{v}+\Delta\vec{w})\cdot\left(\sum_{j=1}^n \vec{\sigma}_j\right) - \sum_{j<k=1}^n \theta^2(\vec{v}\cdot\vec{\sigma}_j)(\vec{v}\cdot\vec{\sigma}_k). \qquad (15)$$

The leading I term in $|\langle\psi|A_0^{\otimes n}|\psi\rangle|^2$ will always be $1-\Theta(nr)$ regardless of state $|\psi\rangle$ and the relative size of p and $\theta^2$.

The real part of the second term $\Delta\Sigma\vec{w}\cdot\vec{\sigma}_j$ of contributes $O(\Delta n)$. The remaining terms $i\theta\Sigma\vec{v}\cdot\vec{\sigma}_j$ and $\Sigma\theta^2(\vec{v}\cdot\vec{\sigma}_j)(\vec{v}\cdot\vec{\sigma}_k)$ can contribute $O(\theta^2 n^2)$, the imaginary one giving the square of something with n terms and the real one having $n^2$ terms.

If $p=\Theta(r)$ and $\theta^2=o(r)$, then G(n) is a function of p and $\Delta$ and finding that $G(n)=\Theta(n)$, so a=1. If $\theta^2=\Theta(r)$ and $p=o(r)$, then G(n) is a function of $\theta^2$. In this case, a could be higher than 1, but not more than 2. If both p and $\theta^2$ are $\Theta(r)$, then all of p, $\Delta$, and $\theta^2$ contribute to G(n), and again a could be more than 1 but at most 2.

In particular, when $\theta^2=\Theta(r)$, evaluating the contribution of $i\theta\Sigma\vec{v}\cdot\vec{\sigma}_j$ and $\Sigma\theta^2(\vec{v}\cdot\vec{\sigma}_j)(\vec{v}\cdot\vec{\sigma}_k)$ to G(n) is of importance. Again in the basis where U is diagonal, the GHZ state $$|\psi\rangle = \frac{1}{\sqrt{2}}(|0 \ldots 0\rangle + |1 \ldots 1\rangle) \text{ yields } \langle\psi|Z_j|\psi\rangle = 0 \text{ and} \quad (16)$$

$$\left\langle \psi \left| \sum_{j<k} \theta^2 Z_j Z_k \right| \psi \right\rangle = \theta^2 n(n-1)/2.$$

Thus, $G(n) \geq n\theta^2 + n^2\theta^2$, which allows for the possibility of states other than the GHZ giving higher infidelity, so a=2 in this case.

In fact, the GHZ achieves the highest possible quadratic scaling $n^2\theta^2$: the i term can only contribute positively to F(n,r) since it gets an absolute value squared. Thus, the largest contribution it can make to infidelity is to be 0 as with the GHZ state. The $\Sigma_{jk}$ term is also maximal for the GHZ state. For fixed n, it is possible that some state other than GHZ could be optimal (e.g., at least when p and θ are both relevant), but as n approaches infinity, the quadratic term will dominate and GHZ state is asymptotically optimal.

Proving lemma 1: Initially, the present disclosure uses the Choi-Jamiolkowski isomorphism to get the state $$\Phi_r = (I \otimes C_r)(|\phi^+\rangle\langle\phi^+|) \cdot |\phi^+\rangle = \frac{1}{\sqrt{d}} \sum_{j=1}^{d} |dd\rangle$$

is maximally entangled state. Since $C_r$ is close to the identity, $\Phi_r$ is close to $|\phi^+\rangle$, and in particular, $$\langle \phi^+ | \Phi_r | \phi^+ \rangle = 1 - \Theta(r). \quad (17)$$

The upper and lower bounds on the fidelity are d-dependent, but the present disclosure considers d to be a constant here. Thus, one can diagonalize $\Phi_r$:

$$\Phi_r = \sum_k \lambda_k |\phi_k\rangle\langle\phi_k|. \quad (18)$$

The $|\phi_k\rangle$ are orthonormal pure states and $\Sigma_k \lambda_k = \text{tr}\Phi_r = 1$.

$$\langle \phi^+ | \Phi_r | \phi^+ \rangle = \sum_k \lambda_k |\langle \phi^+ | \phi_k \rangle|^2 \quad (19)$$

Assume without loss of generality that $|\langle \phi^+ | \phi_k \rangle|^2$ is largest for k=0. Then $\langle \phi^+ | \Phi_r | \phi^+ \rangle \leq |\langle \phi^+ | \phi_0 \rangle|^2$, so for the former to be $1-\Theta(r)$, one must have $|\langle \phi^+ | \phi_0 \rangle|^2 = 1-O(r)$. Now, $\Sigma_k |\langle \phi^+ | \phi_k \rangle|^2 = 1$, or $\leq 1$ if the $|\phi_k\rangle$ do not form a full basis, so $|\langle \phi^+ | \phi_k \rangle|^2 = O(r)$ for $k \neq 0$. It must therefore also be the case that $\lambda_0 = 1 - O(r)$. However, this implies that $\lambda_k = O(r)$ for $k \neq 0$.

The relevance of the above is choosing the Kraus operators for $C_r$ to be $$A_k|\psi\rangle = \sqrt{d\lambda_k} \langle \psi^* \otimes I |\phi_k\rangle, \quad (20)$$

where the * means complex conjugate in some basis used to define $A_k$. This means that $\|A_k\|_\infty = O(\sqrt{\lambda_k}) = O(\sqrt{r})$ for $k \neq 0$, proving the lemma.

Now that a general overview of characterizing the coherent part of a channel and determining a maximum amount of quadratic error scaling possible for any given channel have been described, determining how a set of GHZ states is a maximally sensitive set of states and how to implement simple protocols that are maximally sensitive to coherent errors are discussed below.

Example 2: Maximally Sensitive Set of States

Definition (2): Let $S_n$ be a set of n-qudit states for $n = n_0$, $n_1, \ldots$ an infinite monotonically increasing sequence of positive integers. Then $\{S_n\}$ is a maximally sensitive set if, for any family of qudit channels $C_r$ with quadratic accumulation, there exists a sequence of states $|\psi_i\rangle \in S_{n_i}$ such that $\tilde{G}(\{|\psi_i\rangle\}, n_i) = \Theta(n_i^2)$, where $$\tilde{G}(\{|\psi_i\rangle\}, n_i) = \lim_{r \to 0} [1 - \tilde{F}(|\psi_i\rangle, n_i, r)]/r, \quad (21)$$

$$\tilde{F}(|\psi_i\rangle, n_i, r) = \langle \psi_i | C_r^{\otimes n}(|\psi_i\rangle\langle\psi_i|) |\psi_i\rangle. \quad (22)$$

Here, $\tilde{F}$ and $\tilde{G}$ are defined just like F and G in Definition (1), but for a specific sequence of states $|\psi_i\rangle$. Thus, a maximally sensitive set of states is one for which, for any channel that has quadratic accumulation, there is a sequence of states drawn from the set for progressively larger numbers of qubits which witness the quadratic accumulation of error.

When $S_n$ is the full Hilbert space on n qubits, it trivially forms a maximally sensitive set of states. However, it is not immediately clear that maximally sensitive sets exist where each set $S_n$ is finite. For instance, the proof of theorem 1 shows that to realize the optimal quadratic scaling one would need $S_n$ to be the set of all GHZ states in every basis, an infinite set.

If optimal scaling is not demanded, but merely scaling within a constant factor of optimal, then for qubits, it is sufficient to take the GHZ states in just three bases, the eigenbases of X, Y, and Z:

Theorem 2: Let $S_n$ consist of the three states $$|\psi_{n,P}\rangle = \frac{1}{\sqrt{2}}(|0_P, 0_P, \ldots, 0_P\rangle + |1_P, 1_P, \ldots, 1_P\rangle),$$

where $|0_P\rangle$ and $|1_P\rangle$ are the +1 and −1 eigenstates of the Pauli P, which runs over X, Y, and Z. Then $\{S_n\}$ is a maximally sensitive set. Moreover, for any family of channels $C_r$ with quadratic accumulation, $\tilde{G}(\{|\psi_{n,P}\rangle\}, n)$ is at least ⅓ of the optimal quadratic scaling for $C_r$ for at least one of P=X, Y, Z.

Here, $$|b_Z\rangle = |b\rangle, |b_X\rangle = \frac{1}{\sqrt{2}}(|0\rangle + (-1)^b|1\rangle),$$

and $$|b_Y\rangle = \frac{1}{\sqrt{2}}(|0\rangle + i(-1)^b|1\rangle).$$

Note that there is a convention choice in the relative phase of $|0_Y\rangle$ versus $|1_Y\rangle$, since one could have equally chosen $$|1_Y\rangle = \frac{1}{\sqrt{2}}(i|0\rangle + |1\rangle),$$

also a −1 eigenstate of Y but one that gives us a different $|\psi_{n,Y}\rangle$. There is a similar convention choice in $|b_X\rangle$ and $|b_Z\rangle$, but those choices are more standard. The effects of this choice are described in more detail below, for instance, in determining the basis needed for measurement of the state.

Proof: Begin with equation (15). Then, to leading order:

$$\langle \psi_{n,P}|A_0^{\otimes n}|\psi_{n,P}\rangle = (1-np-n\theta^2/2) + 0 - (_2^n)\theta^2 v_P^2 \quad (23)$$

and $$\tilde{F}(|\psi_{n,P}\rangle, n, r) = 1 - 2np - n(1-v_P^2)\theta^2 - n^2\theta^2 v_P^2. \quad (24)$$

Since $\vec{v}$ is a unit vector, $v_P^2 \geq 1/3$ for at least one P.

Again, the accumulation depends on which of $\theta^2$ and p are $\Theta(r)$. If only p is, the accumulation is linear. If $\theta^2$ is $\Theta(r)$, then the accumulation is quadratic, and the quadratic term in $\tilde{G}(\{|\psi_{n,P}\rangle\}, n)$ is a factor $v_P^2$ less than the value for a GHZ state in the eigenbasis of U. That is, for at least one P, $\tilde{G}(\{|\psi_{n,P}\rangle\}, n)$ is within a factor 1/3 of the optimal quadratic scaling.

While it is not usually possible in reality to take the limit $r \to 0$, when r is small, the o(r) terms will be negligible. One can expect the formulas to break down if $n^2 r$ is close to 1 or if $p^2$ is about $\theta^2$. Otherwise, the leading order r behavior should be close to correct.

A maximally sensitive set of states with finite $S_n$ gives a natural protocol for detecting coherent errors in a family of channels, provided the channel is sufficiently close to the identity: Prepare the states in $S_n$ for a wide enough range of ns, apply the channel to all qubits, and look at the scaling with n of the fidelity to the initial state for subsequences. In the case of the GHZ states, look at subsequences all in the same bases; in the general case, it is sufficient to look at the subsequence consisting of the states with the highest infidelity for each $S_n$.

In the case of the three GHZ states, the present disclosure deduces additional information from the measured scaling. The pre-factor of the quadratic scaling rate, if any, of the P-basis GHZ states provides $\theta^2 v_P^2$. Measured for all three bases determined that $\theta^2$ and the unit vector $\vec{v}$, giving a complete description of U, the coherent part of the channel.

Example 2(1): Measuring with Single-Qubit Measurements

Even though the present disclosure considers an idealized model where there are no gate errors, it is inconvenient in practice to have to create multi-qubit entangled states and to make an entangled measurement. Luckily, the same information can be determined out about the accumulation order of the channel and a characterization of U by making single-qubit measurements on the three GHZ states of our maximally sensitive set.

In particular, if taking a GHZ state and measuring each qubit in the X basis—or equivalently perform Hadamard on each qubit and measure in the Z basis—the state in the absence of error will be a superposition of all even-weight bit strings. Therefore, if measuring individual qubits but discarding all information other than the parity of the classical output string, this performs a rank-$2^{n-1}$ projective measurement with projectors H, I-H plus additional discarded information. Post-Hadamard, $\Pi = \Sigma_x |x\rangle\langle x|$, where the sum is over all even weight x. Pre-Hadamard, this is equivalent to $$\Pi_Z = \frac{1}{2}\sum_x (|x\rangle + |\bar{x}\rangle)(\langle x| + \langle\bar{x}|), \quad (25)$$

where the sum is now over all x and $\bar{x}$ is the bit string where all bits of x have been flipped $0 \leftrightarrow 1$. That is, the measurement distinguishes between the states in the subspace spanned by $|x\rangle + |\bar{x}\rangle$ from those in the subspace spanned by $|x\rangle - |\bar{x}\rangle$.

The above procedure can be conducted for any of the three GHZ states, giving three projective measurements $\Pi_P$ for the GHZ states $|\psi_{n,P}\rangle$. For a state $|\psi_{n,Z}\rangle$, conduct the X basis measurement or the Hadamard and Z-basis measurement as described above. For $|\psi_{n,X}\rangle$ or $|\psi_{n,Y}\rangle$, simply measure each qubit directly in the Z basis.

For the basis P, one of the other Paulis P' will take $|0_P\rangle$ to $|1_P\rangle$ and vice-versa. For P=Z, P'=X, and for P=X or P=Y, P'=Z. The remaining Pauli P" (i.e., Y, X, and Y for the bases P=X, Y, Z respectively) acts like Y in the Z basis, flipping the bit but also changing the phase. Thus, a single P' acting on $|\psi_{n,P}\rangle$ moves us within the subspace projected on by $\Pi_P$, whereas a single P or P" takes us out. Let $$|\psi_{n,P}(j)\rangle = P'_j|\psi_{n,P}\rangle = \frac{1}{\sqrt{2}}(|e_{j,P}\rangle + |\bar{e}_{j,P}\rangle),$$

where $e_j$ is the bit string with a 1 in the jth bit and 0s elsewhere. Similarly, let $|\psi_{n,P}(j,k)\rangle = P'_j P'_k |\psi_{n,P}\rangle$.

Again starting from equation 15, yields:

$$\Pi_P A_\theta^{\otimes n}|\psi_{n,P}\rangle = (1 - np - n\theta^2/2)|\psi_{n,P}\rangle + (i\theta v_{P'} + \Delta w_{P'})\sum_j |\psi_{n,P}(j)\rangle -$$

$$-\sum_{j<k}\theta^2[v_P^2|\psi_{n,P}\rangle + v_P v_{P''}(|\psi_{n,P}(j)\rangle + |\psi_{n,P}(k)\rangle) + (v_{P'}^2 + v_{P''}^2)|\psi_{n,P}(j,k)\rangle].$$

The probability squared of this outcome is therefore:

$$(1-np-n\theta^2/2-\theta^2(_2^n)v_P^2)^2 + n\theta^2 v_P^2 + n[\Delta w_P - \theta^2(n-1)$$
$$v_P v_{P''}]^2 + (_2^n)\theta^4(v_{P'}^2 + v_{P''}^2)^2. \quad (27)$$

Discarding the lower-order terms, the probability squared of the $\Pi_P$ outcome is determined as:

$$1 - 2np - n\theta^2(1 - v_{P'}^2 - v_{P''}^2) - n^2\theta^2 v_P^2. \quad (28)$$

Once again, the coefficient of the $n^2$ term yields $\theta^2 v_P^2$, and running over P=X, Y, Z, one can deduce $\theta$ and $\vec{v}$.

Using this technique, the present disclosure can identify coherent errors as follows:

Protocol (1): [Identifying coherent errors in a channel]. Choose a sequence of values for n. The sequence of values should span a large enough range to distinguish quadratic from linear behavior and the largest n should satisfy $n^2 r \ll 1$.

1. For each value of n, create copies of $|\psi_{n,X}\rangle$, $|\psi_{n,Y}\rangle$, and $|\psi_{n,Z}\rangle$.
2. Run all n qubits of each state through the channel $C_r$.
3. Measure the qubits of $|\psi_{n,X}\rangle$ and $|\psi_{n,Y}\rangle$ in the Z basis and measure the qubits of $|\psi_{n,Z}\rangle$ in the X basis.
4. Count the outcome as an error if the outcome bit string for a particular state has odd parity. Determine the error rate for each state.
5. Fit the error rates for different n for each basis P to a quadratic $a_P n^2 + b_P n + c_P$.
6. Let $\theta^2 = a_X + a_Y + a_Z$ and $v_P^2 = a_P/\theta^2$. These are the parameters of the coherent error in the channel $C_r$.

Example 2(2): Using Fewer Qubits

Figure 4:
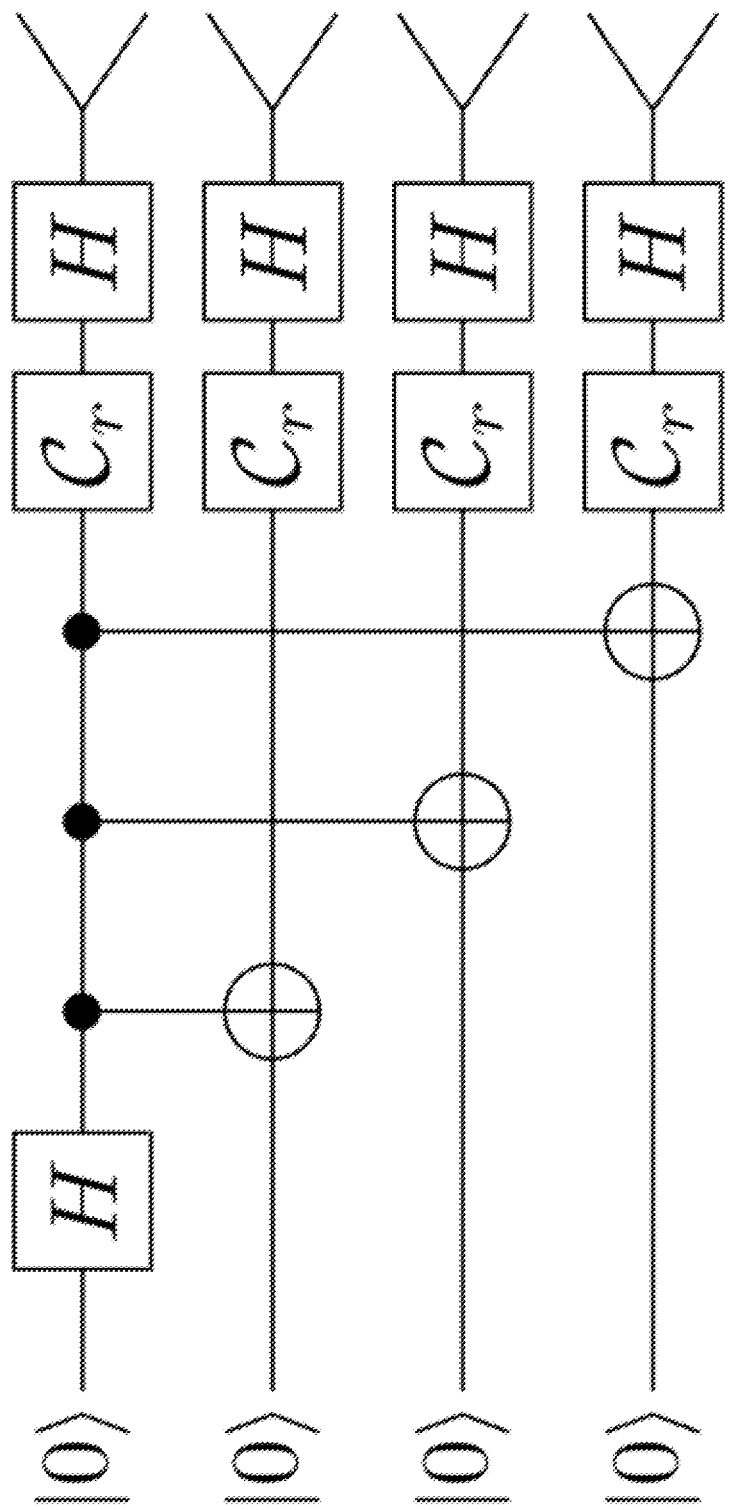
FIG. 4 illustrates a first protocol for a state using four physical qubits, in accordance with an embodiment of the present disclosure.

Another drawback of the protocol, as described supra, is that it requires many qubits. Having the ability to measure and reset qubits during the computation, the number of qubits can be substantially reduced and the protocol can be easily run using just two qubits. Referring to FIG. 4, this is because the GHZ states in the instant standard maximally sensitive set can be created via a straightforward circuit, which starts one qubit in the state $|0\rangle+|1\rangle$ and then does a sequence of CNOTs to each of the other n−1 qubits, which all start in the state $|0\rangle$. Specifically, FIG. 4 illustrates the protocol for the state $|\psi_{4,Z}\rangle$ using 4 physical qubits. Each qubit can then be rotated into the basis for the appropriate GHZ state. Then the channel is applied, and finally, rotate each individual qubit to the appropriate basis for measurement.

Figure 5:
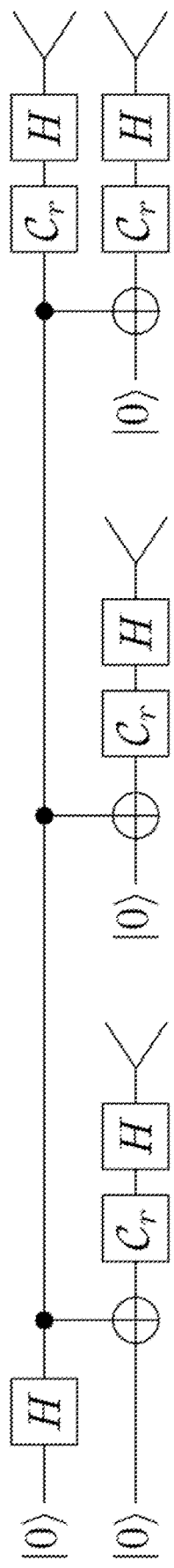
FIG. 5 illustrates a second protocol for a state using two physical qubits, in accordance with an embodiment of the present disclosure.

That means that except for the first qubit, each qubit experiences exactly one CNOT gate, followed by a sequence of single-qubit gates and measurement. Therefore, the present disclosure can perform the CNOT to the ith qubit, follow it by a single-qubit rotation to get the ith qubit into the right basis if necessary, apply the channel, rotate again to the measurement basis, and then measure the ith qubit, all without needing to do anything to the jth qubit for j>i. That is, the present disclosure can complete the measurement for the ith qubit before even starting to interact the (i+1)th qubit with the first qubit. Referring to FIG. 5, the procedures for qubits 2 through n can be done sequentially on a single physical qubit, recording each measurement and then resetting the physical qubit to $|0\rangle$. Specifically, FIG. 5 illustrates the protocol for the state $|\psi_{4,Z}\rangle$ using 2 physical qubits. The first qubit must maintain its coherence throughout this procedure. At the end, once qubits 2 through n have all been entangled and measured, then do the single-qubit operations for the first qubit: rotate to the appropriate basis for the GHZ state, apply the channel to it, rotate it to the measurement basis, and measure. Calculate the parity of all n measurement outcomes, the n−1 measurements on the second physical qubit as well as the final measurement on the first qubit.

While the above described version of the procedure is a bit more difficult to apply in a communications scenario where interest is in channel noise, it is a very useful variant when interested in testing for coherent errors in gates, as described infra.

Now that a general overview for determining how a set of GHZ states is a maximally sensitive set of states and how to implement simple protocols that are maximally sensitive to coherent errors have been described, determining quadratic accumulation and maximally sensitive states for qubits are discussed below.

Example 3: Qubits

Definitions (1) and (2) are phrased for qudits of arbitrary dimension d. However, thus far only Theorems (1) and (2) are proven for only for qubits. The main complicating factor in going to qudits with d>2 is that the description of U and D appearing through the singular value decomposition of $A_0$, equation (8), is more complicated.

Before getting started, a set of operators P is selected to generalize the Paulis. The present disclosure requires that $P \in \mathcal{P}$ is unitary, that the operators in $\mathcal{P}$ form a basis for the space of d×d matrices, that $I \in \mathcal{P}$, and that $P \in \mathcal{P}$ is traceless if $P \neq I$. One possible choice is the Heisenberg-Weyl operators $P = X^a Z^b$, a,b=0, ... d−1, $$X|j\rangle = |j+1 \mod d\rangle \qquad (29)$$

$$Z|j\rangle = w^j |j\rangle \qquad (30)$$

$$w = e^{2\pi i/d}. \qquad (31)$$

Another option if $d=2^m$ is to treat the qudit as m qubits and use the m-qubit Pauli group, which can be generalized to powers of odd primes as well. Since the Ps form a basis for operators on the d-dimensional Hilbert space, for any M, one can write $M = \Sigma_P m_P P$. If M is Hermitian, $M = M^\dagger$, which implies that $m_P = m_{P^\dagger}^*$.

Now returning to determining error accumulation, D is Hermitian and U is unitary, so one can write $U = \exp(i\theta H)$, where H is Hermitian as well. Let $H = \Sigma_P h_P P$ and $D = \Sigma_P d_P P$. Choosing $\theta$ so that $\Sigma_P |h_P|^2 = 1$. One can also assume $h_I = 0$ since that merely contributes a global phase to U, which can be removed from $A_0$. Also, let $d_I = 1-p$. Then in order to have $A_0^\dagger A_0 \leq I$, it must be the case that all $d_P = O(p)$.

Again expanding to leading order in each Pauli yields:

$$A_0 = \left(1 - p - \frac{\theta^2}{2}\right)I + \sum_{P \neq I} (i\theta h_P + d_P) P \qquad (32)$$

and $$A_0^{\otimes n} = \left(1 - np - \frac{n\theta^2}{2}\right)I + \sum_{P \neq I}\sum_j (i\theta h_P + d_P) P_j - \sum_{P,Q \neq I}\sum_{j<k} \theta^2 h_P h_Q P_j Q_k. \qquad (33)$$

For a single qudit, let $|\psi\rangle\langle\psi| = \Sigma_P c_P P$. Since P is traceless unless P=I, $c_I = 1/d$. By discarding lower-order terms, this yields:

$$tr\, A_0 |\psi\rangle\langle\psi| = 1 - p - \frac{\theta^2}{2} + d\sum_{P \neq I} (i\theta h_P + d_P) c_{P^\dagger} \qquad (34)$$

$$|tr\, A_0 |\psi\rangle\langle\psi||^2 = \qquad (35)$$

$$1 - 2p - \theta^2 + d\sum_{P \neq I} [i\theta(h_P c_{P^\dagger} - h_{P^\dagger} c_P) + d_P c_{P^\dagger} + d_{P^\dagger} c_P] + $$

$$+ d^2 \theta^2 \sum_{P,Q \neq I} h_P h_{Q^\dagger} c_{P^\dagger} c_Q$$

$$= 1 - 2p - \theta^2 + 2d\sum_{P \neq I} d_P c_{P^\dagger} + d^2 \theta^2 \sum_{P,Q \neq I} h_P h_{Q^\dagger} c_{P^\dagger} c_Q, \qquad (36)$$

since $\Sigma h_P c_{P^\dagger} = \Sigma h_{P^\dagger} c_P$ and $\Sigma d_P c_{P^\dagger} = \Sigma d_{P^\dagger} c_P$ by reordering the sums. Thus, as for qubit channels, one must have at least one of p and $\theta^2$ be $\Theta(r)$.

Let P and Q be non-commuting Heisenberg-Weyl operators which generate the Heisenberg-Weyl group, so any Heisenberg-Weyl operator can be written as $P^a Q^b$ up to a phase. Let $|\psi_{n,P,Q}\rangle$ be the n-qudit stabilizer state with stabilizer generated by $P_j P_{j+1}^\dagger$ (for j=1, ..., n−1) and $Q^{\otimes n}$. Then $$|tr\, A_0^{\otimes n} |\psi_{n,P,Q}\rangle\langle\psi_{n,P,Q}||^2 = 1 - 2np - n\theta^2 - 2\binom{n}{2}\theta^2 \sum_{s=1}^{d-1} h_{P_s} h_{P_{-s}} \qquad (37)$$

Let $$v_P = \sum_{s=1}^{d-1} h_{P_s} h_{P_{-s}} = \sum |h_{P_s}|^2 \geq 0.$$

Finding a set of S of Ps such that there is always guaranteed to be a $v_P > 0$ for some P is now desired.

Let S be a set of Heisenberg-Weyl operators such that V Heisenberg-Weyl operators R, there is an integer s and a Heisenberg-Weyl operator $P \in S$ such that $R=P^s$. For instance, for any d one can take $S=\{X^a Z^b\}$ for all a, b provided both are not 0. Now having $\Sigma_{P \in S} v_P \geq \Sigma_{P \neq I} |h_P|^2 = 1$. Thus, for some P, $v_P \geq 1/(d^2-1)$. This shows that if $\theta^2$ is $\Theta(r)$, the family of channels has quadratic accumulation, and there will be at least one state $|\psi_{n,P,Q}\rangle$ with $P \in S$ that exhibits the quadratic accumulation.

Smaller sets S always exist. In particular, if d is prime, $S=\{X,Z,X^a Z\}$ for $a=1, \ldots, d-1$ works. In this case, $\Sigma_{P \in S} v_P = \Sigma_{P \neq I} |h_P|^2 = 1$. The quadratic scaling of $\tilde{G}(\{|\psi_{n,P,Q}\rangle\},n)$ is $v_P \theta^2$. There is at least one $v_P \geq 1/(d+1)$, so a tighter bound on the quadratic scaling is provided.

For d a power of 2, a similar result using a different set of GHZ-like states is provided. The same can also be done for powers of other primes. Let B run over a complete set S of mutually unbiased bases (MUBs) for m qubits, each of which is a stabilizer basis. Wootters et al., 1989, "Optimal state-determination by mutually unbiased measurements," Ann. Phys., (191), pg. 363. Let $\{M_a\}$, $a=1, \ldots, m$ be a set of generators of the stabilizer for one state of the basis B and let $Q_a$ be an m-qubit Pauli that anticommutes with $M_a$ and commutes with $M_b$ and $Q_b$ for $b \neq a$. A set of such $Q_a$ always exists and can be found by solving the set of linear equations derived from these anticommutation constraints. For convenience, let B also denote the abelian group generated by $\{M_a\}$, the stabilizer of the chosen state from the basis B; other states in B have the same stabilizer with different eigenvalues. Note that any Pauli on a single qudit will anticommute with at least one of the $M_a$ or $Q_a$.

Let $M_{a,j}$ be $M_a$ acting on the jth d-dimensional qudit. Then let $|\psi_{n,B}\rangle$ be the n-qudit stabilizer state with generators $M_{a,j} M_{a,j+1}$ and $Q_a^{\otimes n}$ for $a=1, \ldots, m$ and $j=1, \ldots, n-1$. This state is equivalent to m standard n-qubit GHZ states under a local transformation on each d-dimensional qudit.

Note that $|\psi_{n,B}\rangle$ may depend somewhat on the choice of $Q_a$, which are not completely unique. If $Q_a$ anticommutes with $M_a$ and commutes with $M_b$, so does $Q_a M$ whenever M is an element of B, and all Paulis that have the same commutation relations with the $M_a$s have this form. If n is even, all choices of $Q_a$ give the same stabilizer state $|\psi_{n,B}\rangle$. If n is odd, however, each choice of $\{Q_a\}$ gives a different state. The choice of which state from the basis B determines $\{M_a\}$ does not matter, nor does the choice of basis for B.

Now finding that:

$$|tr\, A_0^{\otimes n} |\psi_{n,P,Q}\rangle\langle\psi_{n,P,Q}||^2 = 1 - 2np - n\theta^2 - 2\binom{n}{2}\theta^2 \sum_{M \in B} h_M^2. \qquad (38)$$

Since M is Hermitian in this case, $h_M$ is real. Let $v_B = \Sigma h_M^2$. For a complete set of stabilizer mutual unbiased bases, every Pauli M is in some $B \in S$. As B runs over S, therefore, all non-trivial Paulis and $\Sigma_B v_B = 1$ are obtained. A complete set of mutually unbiased bases contains $d+1$ bases, so once again, at least one $v_P \geq 1/(d+1)$.

Thus, the present disclosure has shown the following theorem 3 generalizing theorems 1 and 2:

Theorem 3: Let $C_r$ be a family of quantum channels as before for qudits of dimension d, and suppose that $C_r$ has order a accumulation. Then $a=1$ or $a=2$. Moreover, given two such families of channels $C_r$ and $C_r'$ with the same leading Kraus approximation $A_0$ for all r, then $C_r$ and $C_r'$ have the same order accumulation. That is, the order depends only on the leading Kraus operator.

Let $S_n = \{|\psi_{n,P,Q}\rangle\}$ with $P \in S$ and Q any Heisenberg-Weyl operator that generates the Heisenberg-Weyl group with P; or when $d=2^m$, let $S_n = \{|\psi_{n,B}\rangle\}$ with $B \in S$. Then $\{S_n\}$ is a maximally sensitive set. For at least one $P \in S$, the quadratic scaling of $\tilde{G}(\{|\psi_{n,P,Q}\rangle\},n)$ or $\tilde{G}(\{|\psi_{n,B}\rangle\},n)$ is at least $1/(d^2-1)$ of the maximum achievable. For d prime or a power of two, this can be tightened to at least $1/(d+1)$ of the maximum achievable for any state.

Once again, by measuring the quadratic scaling for all $d+1$ states, one can recover $\theta^2$ through the sum of the scalings. One cannot fully reconstruct U, however, since only the values $v_P$ or $v_B$ are known. It is likely that by adding more states to make a larger maximally sensitive set, one could gain full information about U. Others have pointed out that for the case $d=2^m$, one could treat the channel as instead a single-qubit channel by tracing out $m-1$ of the qubits composing the qudit. By applying the single-qubit protocol to different decompositions of the qudit into m qubits, this should enable characterization of the coherent error in the channel completely.

As with the qubit case, one can make single-qudit measurements to learn the scaling instead of entangled measurements. If the state used is $|\psi_{n,P,Q}\rangle$, the accepting projector is created by measuring in the Q basis and counting all results for which the dits of the output string add up to a multiple of d. When d is prime, this leads to the projector:

$$\Pi_Q = \frac{1}{d}\sum_{s=0}^{d-1} (Q^s)^{\otimes n}. \qquad (39)$$

Calculating $\langle \psi_{n,P,Q}|(A_0^\dagger)^{\otimes n}\Pi_Q A_0^{\otimes n}|\psi_{n,P,Q}\rangle$ once again yields that the leading order coefficient of $n^2$ is $\theta^2 v_P$. For a state $|\psi_{n,B}\rangle$, one must measure the eigenvalue of $Q_a$ for each qudit and then check that the number of $+1$ eigenvalues of $Q_a$ is even. This is done for all a, and this cannot generally be done with single-qubit measurements. However, if each qudit is rotated so that $Q_a = Z_a$ for the ath qubit in the qudit, then a standard basis measurement of each qubit suffices. Again, this yields that the leading order coefficient of $n^2$ in the infidelity is $\theta^2 v_B$.

Now that a general overview for determining quadratic accumulation and maximally sensitive states for qubits have been described, evaluating what happens when a channel is not the same on all qubits and how to apply randomized compiling to eliminate coherent noise in the gates not being tested are discussed below.

Example 4: Generalizing the Error Mode

Now, consider a more general error models than the original idealized one of perfect gates with the same noisy channel on each qubit.

Example 4(1): Different Channels for Different Qubits

In a real system, the channel will not be identical for all qubits. If each qubit j has a different $p_j$, $\Delta_j$, $\theta_j$, $\vec{v}_j$, and $\vec{w}_j$, then eq. (15) is replaced by:

$$A_0^{\otimes n} = 1 - \sum_j (p_j - \theta_j^2/2)I + \qquad (40)$$

$$\sum_j (i\theta_j \vec{v}_j \cdot \vec{\sigma}_j + \Delta_j \vec{w}_j \cdot \vec{\sigma}_j) - \sum_{j<k} \theta_j \theta_k (\vec{v}_j \cdot \vec{\sigma}_j)(\vec{v}_k \cdot \vec{\sigma}_k).$$

For the three GHZ states $|\psi_{n,P}\rangle$, again only the last sum contributes to the quadratic scaling, giving:

$$F(|\psi_{n,P}\rangle, n, r) = 1 - 2\sum_{j<k}\theta_j\theta_k v_{P,j}v_{P,k} + o(n^2\theta^2) \quad (41)$$

$$= 1 - \left(\sum_j \theta_j v_{P,j}\right)^2 + \sum_j \theta_j^2 v_{P,j}^2 + o(n^2\theta^2). \quad (42)$$

The sum over $\theta_j^2 v_{P,j}^2$ only has n terms and therefore cannot contribute to quadratic scaling. If the $v_{P,j}$ vary wildly, and in particular if they often differ in sign, the sum $\Sigma\theta_j v_{P,j}$ will largely cancel and there will be no quadratic scaling at all. If the $v_{P,j}$ and $\theta_j$ all have the same sign and do not generally decrease in size for large n, then there will be some quadratic scaling, with a coefficient given by the square of the average of $\theta_j v_{P,j}$.

$$\theta = \frac{1}{n}\sum_j \theta_j, \, v_P = \frac{1}{n}\sum_j v_{P,j}, \, \theta_j = \theta + \delta_j, \, v_{P,j} = v_P + \eta_{P,j}.$$

Then $$\sum_j \theta_j v_{P,j} = n\theta v_P + \sum_j \delta_j \eta_{P,j}, \quad (43)$$

since $\Sigma\delta_j = \Sigma\eta_{P,j} = 0$. When measuring the scaling for all three GHZ states, this yields quantity for P=X, Y, Z.

Now, $\Sigma_P v_{P,j}^2 = 1$, so $$n = \sum_{P,j} v_{P,j}^2 = n\sum_P v_P^2 + \sum_{P,j} \eta_{P,j}^2 \quad (44)$$

This means that $\vec{v}=(v_X, v_Y, v_Z)$ need not be a unit vector, $$|\vec{v}| = 1 - \frac{1}{n}\sum_{P,j} \eta_{P,j}^2, \quad (45)$$

but if all $\eta_{P,j}$ are small, it is close to a unit vector, up to the variance squared. When $\delta_j$ is likewise small, this provides the average $\theta$ and $v_P$ up to second order in the perturbations.

Example 4(2): Noisy Gates

If the gates used to create the states are imperfect, there is the possibility that one could see a quadratic accumulation of error due to noise in the gates rather than the channel being tested. In the most general case, if using at least $n^2$ gates to create or measure the states in our maximally sensitive set, then any kind of error in the gates could lead to a $\Theta(n^2)$ scaling in the error rate measured, even without any coherent part to the noise. This seems unavoidable if insisting on using states that require this many gates to create or measure.

Luckily, the GHZ states from Example 2 can be created using O(n) gates, so this particular issue does not affect the protocol derived from them. However, it is still the case that coherent noise in the gates used to create or measure the GHZ states could be confused with coherent noise in the channel. Accordingly, the present disclosure provides how to remove the ambiguity.

In particular, the present disclosure operates in a model for which Pauli gates are essentially noiseless, meaning they have noise o(r), so negligible in the limit r→0. All other gates, state preparations, and measurements may have arbitrary noise that affects only the qubits involved in the gate. It is actually sufficient for the noise on the Paulis to be gate-independent, so all Paulis experience the same noise process; in this case, the noise on the Paulis can be absorbed into noise on the other gates. Wallman et al., (2016).

The present disclosure models noisy gates as a unitary G followed by a quantum channel $\mathcal{D}$. . G is the ideal action of the gate in the absence of noise. $\mathcal{D}$. is a channel that acts on the qubits affected by the gate, so in the case of a 2-qubit gate, it is an arbitrary 2-qubit channel. In order to put this in the same framework as the other portions of the present disclosure, consider a family of noisy gates with the ideal gate G followed by a quantum channel $\mathcal{D}._s$, where s is now the worst-case fidelity of the gate. If s and r scale at different rates, the whole discussion is moot—if s=o(r), the gate noise does not contribute at all to the leading order behavior of the system with r, whereas if r=o(s), little hope of seeing the noise in the channel over the noise in the gates is provided. Therefore, assume $s=\Theta(r)$. For simplicity, the present disclosure assumes that all gates have the same noise $\mathcal{D}._s$, but this is not necessary except for notational convenience.

Consider analyzing $\mathcal{D}._s$ in a similar way to how $C_r$ is analyzed in theorem 1 and Example 3. Evaluate the first Kraus operator $B_0$ of $\mathcal{D}._s$ and decompose into a coherent unitary part exp(iwK) and a Hermitian part. A similar analysis shows that, when there are O(n) gates, there is no possibility that $\mathcal{D}._s$ can make a quadratic contribution to the error rate measured in the system unless $w^2=\Theta(r)$. However, when $\mathcal{D}._s$ does have a coherent part of the requisite size, there is at least the possibility that it will make a quadratic contribution and thus be potentially confused with coherent error in the channel. Whether or not this actually does happen will depend on the interaction of the noise with the circuit being performed.

In order to prevent the above from happening, one can modify the circuit in order to avoid any quadratic accumulation of noise from the gates. Of course, one must be careful to do so in a way that still allows errors from the channel to accumulate quadratically.

The approach will be based on randomized compiling. Wallman et al., (2016). Taking advantage of the fact that the only gates to encode or measure a GHZ state (in any of the three bases) are Clifford group gates, which have the property that they conjugate Pauli operators into other Pauli operators. In particular, consider performing an independent uniformly random two-qubit Pauli operator P before and after each gate noise step. Instead of noise $\mathcal{D}._s$, this would yield $\mathcal{D}'_s = \frac{1}{16}\Sigma_P P \mathcal{D}_s P. \mathcal{D}'_s$ is a stochastic channel with first Kraus operator $B_0=qI$, which in all other Kraus operators are non-trivial Paulis. It will never cause quadratic accumulation of errors from O(n) gates. In the limit of s→0, $\mathcal{D}'_s \rightarrow I$, so the Paulis have no effect on the gate when there is no error.

Of course, one cannot insert the Pauli P between the gate G and the noise, since the separation between them is just a mathematical fiction. However, PG=GQ, where $Q=G^\dagger PG$ is another Pauli operator (e.g., on two qubits if G is a two-qubit gate). Therefore, performing Q before the gate and P after the gate and noise, converts the noise in the gate into stochastic noise. Doing this for every noisy gate, using independently chosen P and Q, all the gate noise becomes of a form that cannot interfere with the quadratic accumulation signal of interest. One can simplify the resulting circuits slightly by combining sequential Paulis.

Figure 6:
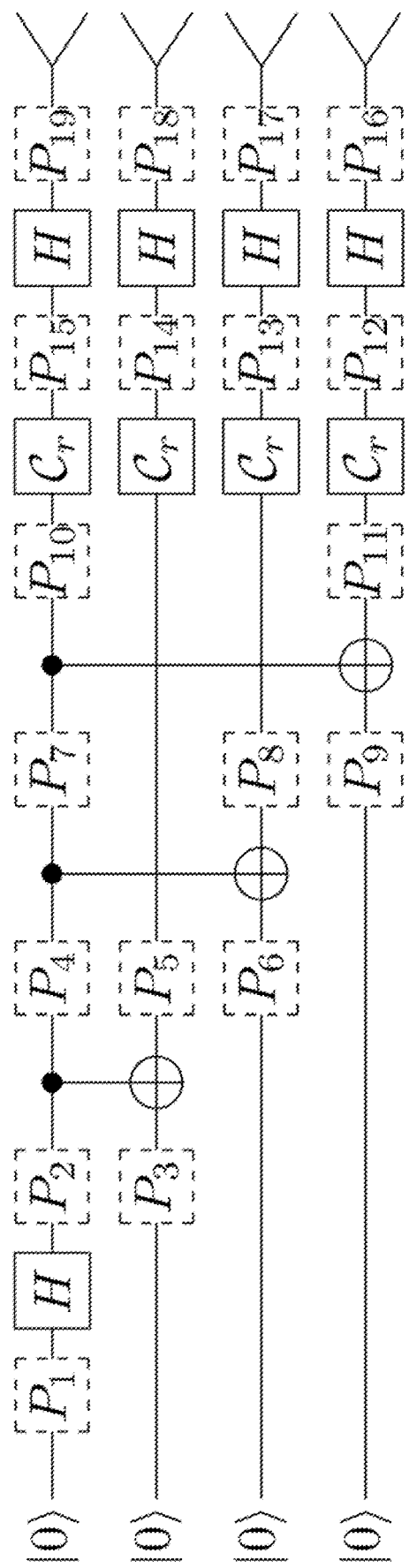
FIG. 6 illustrates a third protocol for a state using randomized compiling, in accordance with an embodiment of the present disclosure.

Referring to FIG. 6, the protocol for the state $|\psi_{4,Z}\rangle$ using randomized compiling to convert all errors except those in the channel $C_r$ into stochastic errors is provided. The Paulis $P_i$, depicted in dashed boxes to distinguish them from the original gates of the circuit, combine a random Pauli for the preceding gate with a random Pauli for the subsequent gate conjugated by that gate. For example, if the random Pauli for the preparation of the second qubit is Z and the random Pauli for the first CNOT gate is $X \otimes X$, then $P_3 = Z$ and $P_5 = X$.

One small but important difference from regular randomized compiling is that after creating the appropriate state from our maximally sensitive set, the Pauli frame must return to the identity. That is, in the absence of noise, the circuit should create the actual desired state from the maximally sensitive set, not some Pauli twirled version of it. In particular, the present disclosure does not twirl the channel $C_r$. Normally randomized compiling would be applied to the full circuit, and any intermediate state would be therefore be altered from its unrandomized version.

In the case of the GHZ states, it would be acceptable to have $|00 \ldots 0\rangle - |11 \ldots 1\rangle$ in whichever basis instead of the + version, but $|x\rangle + |\bar{x}\rangle$ for $x \neq 00 \ldots 0$ would not work. Instead of seeing an error rate proportional to $n^2$, the rotations on the 1 bits of x would cancel with the rotations on the 0 bits of x, and the signal would be reduced to something proportional to $(2 \text{ wt}(x) - n)^2$. In the typical case where $\text{wt}(x) = n \pm O(\sqrt{n})$, this means the scaling of errors would just be linear in n; one would have eliminated the signal along with the extraneous gate noise. This is why it is important to have all Paulis cancel before applying the channel.

All gates used in the circuit are twirled for encoding or measurement. State preparation and measurement are also twirled, but that is a bit more subtle since one can only insert a Pauli after the state preparation but not before, and before the measurement but not after. For measurement in the standard basis, one could still insert a random Pauli as before and compensate by classically reversing the measurement outcome if the Pauli before the measurement was an X or a Y. Note that a Z just before the measurement would have no effect on the measurement outcome if the measurement were perfect, but could conceivably alter the result when there is noise in the measurement.

Twirling out the errors in the state preparation requires a bit more care. One option is symmetric to the way measurements are handled: put a random Pauli after the state preparation and compensate by preparing a $|1\rangle$ instead of a $|0\rangle$ (or vice-versa) if the Pauli is an X or a Y. However, for this to work, it requires that preparation of both $|0\rangle$ and $|1\rangle$ can be modeled by an ideal state preparation followed by the same noise channel $\mathcal{D}_s$ for both states. This is an additional non-trivial assumption.

Note, though, that phase errors after an ideal state preparation of a basis state have no physical effect. This means that one can ignore them and focus instead on twirling the bit flip errors, which only requires a randomly chosen I or Z. More precisely, suppose that instead of preparing the state $|0\rangle$, the noisy state preparation procedure prepares p. If applying Z 50% of the time randomly to this state, the resulting state is:

$$\rho' = \frac{1}{2}\rho + \frac{1}{2}Z\rho Z = \rho_{00}|0\rangle\langle 0| + \rho_{11}|1\rangle\langle 1|. \quad (46)$$

That is, the state is a mixture of the correct $|0\rangle$ state with probability $\rho_{00}$ and the state with a bit flip $|1\rangle$ with probability $\rho_{11}$. This error has no coherent part and cannot contribute to a quadratic accumulation of error. In fact, essentially the same argument applies to measurements: there is no need to twirl with X and Y, only with I and Z.

An advantage of the above is that provided the noise in the Pauli gates is o(r) and the noise in all other circuit components is O(r) and fits the other assumptions of the error model, one can perform the GHZ maximally sensitive states protocol described in Example (2) with the addition of Pauli twirling, and if observing a quadratic scaling of noise rate with n, the number of qubits, that indicates that there are coherent errors in the channel. The coefficients of the scaling for the three bases describes the parameters of the coherent part of the error, as before.

Now that a general overview for evaluating what happens when a channel is not the same on all qubits and how to apply randomized compiling to eliminate coherent noise in the gates not being tested have been described, determining how to use the protocol to measure coherent errors in gates and measurements is discussed below.

Example 5: Testing for Coherent Errors in Gates and Measurements

Example 5(1): Testing Gates

The protocol can be extended to test for coherent errors in certain kinds of quantum gates, with potential additional assumptions on the noise. Consider testing one type of gate for coherent errors. Modelling the noisy gate as a perfect unitary F followed by one member of a family of quantum channels $C_r$. The basic idea is that instead of creating the states $|\psi\rangle$ from the maximally sensitive set, one creates the states $(F^\dagger)^{\otimes n}|\psi\rangle$, then applies $F^{\otimes n}$ to get $|\psi\rangle$ and measures the fidelity to $|\psi\rangle$ as before.

Clearly, it only makes sense to do this in a situation where gate errors are allowed. Use the model and procedure in Example 4(2). That is, the assumption is that gate noise is Markovian and specific to the qubits involved in the gate, that the noise in Pauli operations is negligible, and that errors in other gates are O(r), with r the worst-case fidelity of the gate being tested.

When F is a single-qubit Clifford group gate, the twirling procedure from Example 4(2) works without any further alteration. Indeed, one can create one of the GHZ states, twirling the initial state preparations and gates involved in the circuit as before, then perform $F^\dagger$ on each qubit, twirling it as well. Since $F^\dagger$ is also in the Clifford group, this still requires only Pauli operations before and after. Then one applies F to each qubit without twirling. Since the noisy gates are modeled as the perfect gate followed by a channel, the effect is the same as applying the channel directly on the relevant GHZ state. Then the measurement and analysis is the same as for testing for coherent noise in a channel.

Arriving at the following protocol:

Protocol (2): [Identifying coherent errors in a single-qubit Clifford group gate F]. Pick a range of values of n, as in Protocol (1).

1. For each value of n, use randomized compiling to create copies of $|\psi_{n,X}\rangle$, $|\psi_{n,Y}\rangle$, and $|\psi_{n,Z}\rangle$.

2. Apply $F^\dagger$ twirled to each qubit (i.e., choose a random Pauli P and apply $PF^\dagger Q$, where $Q=FPF^\dagger$).
3. Apply F to each qubit without twirling it.
4. Measure the qubits of $|\psi_{n,X}\rangle$ and $|\psi_{n,Y}\rangle$ in the Z basis and measure the qubits of $|\psi_{n,Z}\rangle$ in the X basis.
5. Count the outcome as an error if the outcome bit string for a particular state has odd parity. Determine the error rate for each state.
6. Fit the error rates for different n for each basis P to a quadratic $a_P n^2 + b_P n + c_P$.
7. Let $\theta^2 = a_X + a_Y + a_Z$ and $v_P^2 = a_P/\theta^2$. These are the parameters of the coherent error in the noise channel for F.

Thus, in accordance with protocol (2), one aspect of the present disclosure provides a method, non-transitory computer readable memory and/or a computer system that (A) for a respective value for n that is a positive integer, performs an outer procedure comprising, for each respective state in a plurality of states, where the plurality of states is sufficient to represent all coherent error or evolution of interest in a quantum system, performs an inner procedure comprising: (i) creating a copy of the respective state using randomized compiling, where the respective state entangles n qudits of the quantum system and (ii) obtains one or more measurements of the n qudits in a measurement basis that corresponds to the plurality of states. The method, non-transitory computer readable memory and/or a computer system further (B) forms a respective outcome bit string for the respective state from each measurement of each qudit in the n qudits. Each element in the bit string represents the measured state of a qudit in the n qudts. In some embodiment n is 2, 3, 4, 5, 6, 7, 8, 9, 10, between 10 and 100, or between 5 and 1000, or more. The method, non-transitory computer readable memory and/or a computer system further (C) repeats (A) and (B) a number of times (e.g., two or more times, ten or more times, 100 or more times, 1000 or more times, 10,000 or more times, 100,000 or more times, or between 10 and 10 million times, or more) thereby obtaining a corresponding plurality of outcome bit strings for each respective state in the plurality of states. The method, non-transitory computer readable memory and/or a computer system further (D) determines an error rate for each respective state using the corresponding plurality of outcome bit strings for the respective state for the respective value n. The method, non-transitory computer readable memory and/or a computer system further (E) repeats (A) through (D) for each different n drawn from a plurality of positive integers thereby determining an error rate for each respective state for each respective value n in a plurality of values n. Here, n is a integer value of between 2 and the number of qudits available in the quantum system, in some embodiment. The method, non-transitory computer readable memory and/or a computer system further (F) for each respective state S in the plurality of states, fits the error rate for each respective value n in a plurality of values n obtained for the respective state to a corresponding quadratic function in which the error rate is the dependent variable and n is the independent variable. The method, non-transitory computer readable memory and/or a computer system further(G) uses at least the coefficient for the highest term in each corresponding quadratic function of each respective state to quantify a parameter of the coherent error or evolution of interest.

When F is a non-Clifford group gate, an additional assumption is needed. To twirl, perform $Q=FPF^\dagger$ for a random Pauli P, which may not be a Pauli operator, and therefore the current noise model allows it to have a significant level of coherent noise. While Q will not be needed on every qubit, non-Clifford group gates will be needed for at least ½ of the qubits, which is enough to potentially see a quadratic scaling with n of coherent noise. Since $(F^\dagger)^{\otimes n}|\psi_{n,P}\rangle$ may not be a stabilizer state in this case, it cannot be created using only Clifford group gates.

Therefore, a further assumption is made on the noise model. Suppose F is a single-qubit $C_3$ gate such as the $\pi/8$ phase rotation diag($e^{-i\pi/8}, e^{i\pi/8}$), which means that $FPF^\dagger$ is in the Clifford group whenever P is in the Pauli group. Therefore, for the twirl, add only Clifford group gates to the ideal circuit creating $(F^\dagger)^{\otimes n}|\psi_{n,P}\rangle$. However, one must be able to perform the new Clifford group gates with negligible noise as well as the Paulis. For instance, when F is the $\pi/8$ phase rotation, then the twirl sometimes uses the $\pi/4$ phase rotation $F^2$, which is a Clifford group gate. More generally, one can test the non-Clifford gate F reliably if the gates $FPF^\dagger$ have low noise for all Paulis P, with "low" meaning o(r). If at least one such gate exists, then together with the Clifford group, it forms a universal set of gates and one can make the needed states $(F^\dagger)^{\otimes n}|\psi_{n,P}\rangle$ by approximating $F^\dagger$ with our universal set. Nebe et al., 2001, "The invariants of the Clifford groups," Designs, Codes, Crypt., (24), pg. 99.

Next, consider two-qubit gates. To fully test them, the present disclosure uses a maximally sensitive set of states not for qubits but for 4-dimensional qudits. To test F, creating the state $(F^\dagger)^{\otimes n}|\psi\rangle$ is desired, thus, now treating each F gate as a single-qudit gate by pairing the two qubits into a qudit. If F is a Clifford group gate for qubits (such as the CNOT gate), it makes the most sense to use the GHZ states $|\psi_{n,B}\rangle$ for B running over some set of MUBs. Then everything else works the same as for testing a single-qubit gate.

Example 5(1): Testing Measurements

Testing measurements is a bit more subtle. A noisy single-qubit measurement can be written as a 2-outcome POVM: $\{M_0, M_1\}$. Each $M_i$ is positive and $M_0 + M_1 = I$. One can diagonalize $M_0$, which makes $M_1$ diagonal as well. Let U be the change of basis; then $M_0 = UDU^\dagger$, $M_1 = U(I-D)U^\dagger$. Here D is diagonal with its two entries in [0,1] to make sure both $M_0$ and $M_1$ are positive.

The D factor is a probability that the measurement outcome will be wrong; it can only ever accumulate linearly. The U is a change of basis for the measurement and can create quadratic accumulation. A goal is to measure that term. Consider what happens if using the protocol based on the set of three GHZ states. When preparing $|\psi_{n,X}\rangle$ or $|\psi_{n,Y}\rangle$ the next thing to do is to measure each qubit in the Z basis. Thus, the change of basis for the measurement is equivalent to applying U to each individual qubit of the GHZ state. However, when preparing $|\psi_{n,Z}\rangle$, conduct a Hadamard on each qubit before measuring. The change of measurement basis is now equivalent to HUH on each qubit of the GHZ state. When a different channel applies for different states in the maximally sensitive set, the protocol may not work. In particular, the states $|\psi_{n,X}\rangle$ or $|\psi_{n,Y}\rangle$ measure $v_X$ and $v_Y$ for U, but $|\psi_{n,Z}\rangle$ measures $v_Z$ for HUH, which is the same as $v_X$ for U. Thus, redundant information about $v_X$ and none about $v_Z$ is obtained.

However, notice that the effect of $v_Z$ is to perform a phase rotation, which will have no effect on the measurement; one could absorb it into D and not change either D or $M_i$ at all. Thus, assume that $v_Z = 0$ is compressible. Measuring $|\psi_{n,X}\rangle$ and $|\psi_{n,Y}\rangle$ is then sufficient to completely characterize U.

To be more precise, the protocol is:

Protocol (3): [Identifying coherent errors in a single-qubit measurement]. Pick a range of values of n, as in Protocol (1).
1. For each value of n, use randomized compiling to create copies of $|\psi_{n,X}\rangle$ and $|\psi_{n,Y}\rangle$.
2. Measure the qubits of each state in the Z basis.
3. Count the outcome as an error if the outcome bit string for a particular state has odd parity. Determine the error rate for each state.
4. Fit the error rates for different n for each basis P to a quadratic $a_P n^2 + b_P n + c_P$.
5. Let $\theta^2 = a_X + a_Y$ and $v_P^2 = a_P/\theta^2$ for P=X, Y. Set $v_Z = 0$. These are the parameters of the coherent error in the measurement.

Thus, in accordance with protocol (3), one aspect of the present disclosure provides a method, non-transitory computer readable memory and/or a computer system that (A) for a respective value for n that is a positive integer, performs an outer procedure comprising, for each respective state in a plurality of states, where the plurality of states is sufficient to represent all coherent error or evolution of interest in a quantum system, performs an inner procedure comprising: (i) creating a copy of the respective state using randomized compiling, where the respective state entangles n qudits of the quantum system and (ii) obtains one or more measurements of the n qudits in a measurement basis that corresponds to the plurality of states. The method, non-transitory computer readable memory and/or a computer system further (B) forms a respective outcome bit string for the respective state from each measurement of each qudit in the n qudits. Each element in the bit string represents the measured state of a qudit in the n qudts. In some embodiment n is 2, 3, 4, 5, 6, 7, 8, 9, 10, between 10 and 100, or between 5 and 1000, or more. The method, non-transitory computer readable memory and/or a computer system further (C) repeats (A) and (B) a number of times (e.g., two or more times, ten or more times, 100 or more times, 1000 or more times, 10,000 or more times, 100,000 or more times, or between 10 and 10 million times, or more) thereby obtaining a corresponding plurality of outcome bit strings for each respective state in the plurality of states. The method, non-transitory computer readable memory and/or a computer system further (D) determines an error rate for each respective state using the corresponding plurality of outcome bit strings for the respective state for the respective value n. The method, non-transitory computer readable memory and/or a computer system further (E) repeats (A) through (D) for each different n drawn from a plurality of positive integers thereby determining an error rate for each respective state for each respective value n in a plurality of values n. Here, n is a integer value of between 2 and the number of qudits available in the quantum system, in some embodiment. The method, non-transitory computer readable memory and/or a computer system further (F) for each respective state S in the plurality of states, fits the error rate for each respective value n in a plurality of values n obtained for the respective state to a corresponding quadratic function in which the error rate is the dependent variable and n is the independent variable. The method, non-transitory computer readable memory and/or a computer system further (G) uses at least the coefficient for the highest term in each corresponding quadratic function of each respective state to quantify a parameter of the coherent error or evolution of interest.

Example 5(3): State Preparation

State preparation cannot be tested for coherent errors in this approach. Certainly, once the GHZ state is created, there is no need or scope for further state preparation, but the difficulty is more fundamental: state preparation can never have quadratic accumulation by itself.

To see this, the present disclosure models the noisy state preparation as preparing a state p instead of a state $|0\rangle$. One can diagonalize $p = U\sigma U^\dagger$. This is equivalent to creating the mixed state σ, a mixture of 0 and 1 that cannot cause quadratic error accumulation, followed by the unitary rotation U. The U is a coherent error, and it is there one would be looking for quadratic accumulation.

The problem is that when preparing n qubits $\rho^{\otimes n}$, the fidelity to the ideal state $|0 \ldots 0\rangle$ is $(1-r)^n \approx 1 - nr$. Any measurement cannot distinguish the faulty state from the ideal state with probability greater than nr+o(r). This is just linear accumulation.

This is not to say that state preparation cannot contribute to quadratic accumulation of errors or that coherent errors in state preparation are meaningless. For instance, if preparing the state ρ and then waiting n−1 time steps, during each of which there is also an error U, one would have an overall state $U^n \sigma U^n$. With the standard parametrization of U, leads to an infidelity of roughly $n^2 \theta^2$. Note that this is $n^2$ and not $(n-1)^2$—the U from the state preparation does contribute to the quadratic accumulation in this case. However, the bulk of the coherent error comes from the channel errors during the waiting, not the state preparation.

Now that a general overview for determining how to use the protocol to measure coherent errors in gates and measurements has been described, definitions and formulas to study more general circuits are discussed below.

Example 6: Accumulation in More General Circuits

The example of state preparation shows that one must consider linear versus quadratic accumulation in more general contexts than simply applying $C_r^{\otimes n}$ to entangled states. In particular, one might ask if there are channels that do not show quadratic accumulation when applied in parallel but that do show quadratic accumulation when applied sequentially or as part of a larger circuit. One might also wonder if there are channels that can accumulate errors rapidly in conjunction with other different channels even though they do not do so with multiple copies of themselves.

To answer both of these questions, defining accumulation of channels in more general circuits is required. In order to have this be sensible, one still needs to deal with families of channels parametrized by worst-case fidelity r and work with the limit r→0; only then is the limit of n→∞ taken, where n is now the number of channels, possibly different channels, used in a possibly large circuit. This means one will need an infinite family of circuits, and in order to talk about the interaction of different channels, an infinite family of channels is needed, all of which scale in roughly the same way.

For the purposes of this Example only, the present disclosure refers to the definition of accumulation from Example 1 as accumulation in parallel. The present disclosure will illustrate that this can occur for the same channels as accumulation in the more general context and therefore there is actually no need to distinguish the cases.

Definition (3): A nested family of circuits $\{Q_n\}$ is a sequence of quantum circuits for which the circuit $Q_n$ begins with the initial state $|0 \ldots 0\rangle$ for $m_n$ qubits, then performs the sequence of unitaries $U_0, U_1, U_2, \ldots, U_n$ in order. In particular, $U_q$ is the same for all circuits $Q_n$ in the family for n≥q. Each $U_q$ is unitary and may act on any finite (but potentially unbounded) number of qubits. Let $|\psi_n\rangle$ be the final state produced by the circuit $Q_n$, so $|\psi_0\rangle = U_0|0\ldots 0\rangle$ and $|\psi_n\rangle = U_n|\psi_{n-1}\rangle$.

Let $\{C_{j,r}\}$ be a sequence of quantum channels analytic in r, with $r_j(r)$ the worst-case fidelity of $C_{j,r}$ and $r=\sup_j r_j(r)$. Assume that $r_j=\Theta(r)$ for all j. The channels may act on multiple qubits at a time, but the present disclosure further assumes there is some constant (n and r-independent) bound on the number of qubits they act on, usually 2.

Let $\{B_i\}$ be a sequence of linear operations on density matrices. These might be CPTP maps or not. They might be presented as linear operators A on Hilbert space, which can also be interpreted as linear operations on density matrices $\rho\rangle A\rho A^\dagger$; this should be assumed. Let $q_i$ be non-negative integers with $q_i<q_{i+1}$. Then $Q_n(B_1,q_1; B_2,q_2; \ldots; B_j,q_j)$ is the noisy circuit created from $Q_n$ by inserting $B_i$ after $U_{q_i}$. That is, this noisy circuit is obtained by starting with the state $|\psi_{q_1}\rangle$, then performing $B_1$, then the unitaries $U_{q_1+1}, \ldots, U_{q_2}$, then $B_2$, and so on through $B_j$, and finishing off with $U_{q_j+1}$ through $U_n$. Let $\rho_n(B_1,q_1; B_2,q_2; \ldots; B_j,q_j)$ be the state produced by $Q_n(B_1,q_1; B_2,q_2; \ldots; B_j,q_j)$. When all $B_j$ are linear operators on Hilbert space, the state is a pure state $|\phi_n(B_1,q_1; B_2,q_2; \ldots; B_j,q_j)\rangle$.

Let $\rho_{n,r}=\rho_n(C_{0,r},0; C_{1,r},1; \ldots; C_{n,r},n)$. That is, $\rho_{0,r}=C_{0,r}(|\psi_0\rangle\langle\psi_0|)$, the state after $Q_0$ with channel $C_{0,r}$, and $\rho_{n,r}=C_{n,r}(U_n\rho_{n-1,r}U_n^\dagger)$, the state after $Q_n$ with channels $C_{j,r}$.

Let $$F(n,r)=\langle\psi_n|\rho_{n,r}|\psi_n\rangle \qquad (47)$$

be the fidelity between the state produced by the noisy circuit $Q_n(C_{0,r},0; C_{1,r},1; \ldots; C_{n,r},n)$ and the ideal circuit $Q_r$. The dependence on the circuits and channels is suppressed here. Let $G(n)=\lim_{r\to 0}(1-F(n,r))/r$ if the limit exists. Then it is said that the sequence of channels $\{C_{j,r}\}$ has order a accumulation in the circuit family $\{Q_n\}$ if $G(n)=\Theta(n^a)$.

This definition is similar to the definition of accumulation in parallel, but does not quite subsume it in general, since one might have a sequence of states $|\psi_n\rangle$ achieving quadratic accumulation, but which cannot be produced by a nested circuit family. It does, however, include the GHZ states. To see this, consider the following circuit family: $m_n=n+2$. $Q_0$ creates the EPR pair $|00\rangle+|11\rangle$, and $U_n$ is a CNOT gate from qubit n to qubit n+1. Thus, $|\psi_n\rangle$ is the (n+2)-qubit GHZ state. Let $C_{n,r}$ be the channel $C_r$ acting on qubit n. Then $\rho_{n,r}$ is what is obtained from $C_r^{\otimes(n+1)}$ acting on the (n+2)-qubit GHZ state, which was considered in Example 2 (e.g., up to one copy of $C_r$, which will not affect the order of accumulation).

While the definition assumes that the circuits $Q_n$ are unitary, it also covers circuits including non-unitary channels and measurements, since one can purify those to make a larger unitary circuit. The unitaries $U_n$ can act on an unbounded number of qubits partially to accommodate this and partially to allow many gates between insertions of the channels. Note that this also means the definition can encompass cases where there are other sources of noise present and one wants to define the accumulation of errors from a particular sequence of channels relative to the background.

It may be that a particular nested family of circuits prevents the channels from adding fully coherently; this could result in accumulation somewhere strictly between 1 and 2, or it could be even less than 1 in some cases. It is also possible that the accumulation will not be well-defined because the limit for $G(n)$ is not well-defined. However, it will turn out that the accumulation can never be greater than 2, and indeed, if taking the maximum accumulation achievable over all nested families of circuits, that maximum will always be either 1 or 2, as for accumulation in parallel.

Consider a circuit family and sequence of channels as above such that the accumulation is defined. In this context, it may be that some of the channels contribute to the leading order accumulation and some do not, for instance because they are effectively twirled by the circuit relative to the other channels. One can analyze this by looking at the fidelity to the states of the perfect circuit family when that particular channel is present versus when it is not:

Definition (4): Let $\{Q_n\}$, $\{C_{j,r}\}$, and $G(n)$ be as in Definition (3). Let $\rho_{n,r}^j$ be the state produced by the noisy circuit $Q_n(C_{0,r},0; C_{1,r},1; \ldots; C_{j-1,r},j+1; C_{j+1,r},j+1; \ldots; C_{n,r},n)$, that is the noisy circuit containing all channels except for $C_{j,r}$. Let $$F^j(n,r)=\langle\psi_n|\rho_{n,r}^j|\psi_n\rangle \qquad (48)$$

and $G^j(n)=\lim_{r\to 0}(1-F^j(n,r))/r$ if the limit exists. If both $G(n)$ and $G^j(n)$ are well-defined, let $\Delta_j(n)=G(n)-G^j(n)$. When $\Delta_j(n)=\Theta(n^b)$, then the channel family $C_{j,r}$ contributes order b coherent accumulation with $\{C_{j,r}\}$ in the circuit family $\{Q_n\}$.

Equivalently, evaluating:

$$\delta F^j(n,r)=\langle\psi_n|(\rho_{n,r}^j-\rho_{n,r})|\psi_n\rangle \qquad (49)$$

and then let $\Delta_j(n)=\lim_{r\to 0}\delta F^j(n,r)/r$.

Since $G^j(n)$ involves one fewer channel than $G(n)$, in the case where all channels are contributing equally to the accumulation of noise, then $G^j(n)$ should be equal to $G(n-1)$. When $G(n)=Cn^a$, that means that $\Delta_j(n)$ would be $O(n^{a-1})$. It might be, however, that this particular channel contributes more or less noise accumulation than the other channels, and this definition helps to identify that. It could also be that this particular channel decreases the noise, for instance via a coherent rotation in the opposite direction from the other channels. Then $\Delta_j(n)$ will be negative. In the case where the overall accumulation is quadratic, the intuition is that most pairs of channels will constructively interfere to produce a rapid divergence from the noiseless state. The channel $C_{j,r}$ contributes to this if it constructively interferes with a constant fraction of the other channels. Conversely, if it only constructively interferes with a constant number of other channels, or with none at all, then it only contributes a constant amount of coherent accumulation.

Theorem (4): If a channel family $C_{j,r}$ contributes order b coherent accumulation with $\{C_{j,r}\}$ in the circuit family $\{Q_n\}$ with $b>0$, then $b\le 1$ and $C_{j,r}$ has quadratic accumulation in parallel, as does $C_{q,r}$ for $\Omega(n^b)$ values of $q\ne j$. If the maximum value of b for all channel families in $\{C_{j,r}\}$ is $b_{max}$, then the sequence of channels has at most order $b_{max}+1$ accumulation in the circuit family $\{Q_n\}$.

If a channel has quadratic accumulation in parallel, it can also contribute order 1 coherent accumulation in sequence, as the example of GHZ states shows, but that does not mean it always does so in any particular family of circuits. It may be that in a particular family, there are no other channels that it can constructively interfere with, or it may get twirled out relative to the other channels, or perhaps there is both constructive and destructive interference at work which largely cancels out.

Proof: Once again, a leading Kraus approximation is made and considering only $A_0$ for each channel: Let $A_k^q$ be the kth Kraus operator for channel q. Let $\rho_k^q=\rho_n(A_0^0,0; A_0^1,1; \ldots; A_0^{q-1},q-1; A_k^q; q; A_0^{q+1},q+1; \ldots; A_0^n,n)$, the noisy circuit where the leading Kraus approximation is made in all but the location q, where instead having used the Kraus operator $A_k^q$. Let $\rho_0=\rho_n(A_0^0,0; A_0^1,1; \ldots; A_0^n,n)$, where the leading Kraus approximation is made in all locations. Let $\rho_k^{q,j}$ ($q \neq j$) and $\rho_0^j$ be these same quantities but where inserting any error in the jth location is omitted.

Since $\|A_k^j\|_\infty = O(\sqrt{r})$ for $k>0$, then $\|\rho_k^j\| = O(r)$; consider looking at states of the circuits where two locations did not use the leading Kraus approximation, those would be $O(r^2)$. This yields:

$$\rho_{n,r} = \rho_0 + \sum_{q=0}^{n}\sum_{k \neq 0} \rho_k^q + O(r^2) \tag{50}$$

$$\rho_{n,r}^j = \rho_0^j + \sum_{q \neq j}\sum_{k \neq 0} \rho_k^{q,j} + O(r^2) \tag{51}$$

$$\rho_{n,r}^j - \rho_{n,r} = (\rho_0^j - \rho_0) - \sum_{k \neq 0} \rho_k^j + \sum_{q \neq j}\sum_{k \neq 0}(\rho_k^{q,j} - \rho_k^q) + O(r^2). \tag{52}$$

Now, $A_0^q$ is close to I for all q, $A_0^q = 1 + o(1)$. Since $\rho_k^q$ and $\rho_k^{q,j}$ are $O(r)$, it follows that for $k \neq 0$, $$\rho_k^q = \rho_n(A_k^q;q) + o(r) \tag{53}$$

$$\rho_k^{q,j} = \rho_n(A_k^q;q) + o(r), \tag{54}$$

so $\rho_k^{q,j} - \rho_k^q = o(r)$. Thus, $$\rho_{n,r}^j - \rho_{n,r} = (\rho_0^j - \rho_0) - \sum_{k \neq 0} \rho_k^j + o(r). \tag{55}$$

The term $\Sigma \rho_k^j = \Sigma \rho_n(A_k^q;q) + o(r)$ is just a constant size, independent of n, so its contribution to $\Delta_j(n)$ will be a constant. If the channel $C_{j,r}$ is contributing non-constant accumulation, it must come from the term $\rho_0^j - \rho_0$.

Since the worst-case fidelity of $C_{j,r}$ is $\Theta(r)$, by equation (36), it is still the case that at least one of p and $\theta^2$ for each channel must be $\Theta(r)$. Expand each $A_0^q$ as in equation (32):

$$A_0^q = (1 - p_q - \theta_q^2/2)I + \sum_{P \neq I}(i\theta_q h_{q,P} + d_{q,P})P. \tag{56}$$

Since all of the $A_0^q$ are linear operators on Hilbert space, the states $\rho_0 = |\phi_0\rangle\langle\phi_0|$ and $\rho_0^j = |\phi_0^j\rangle\langle\phi_0^j|$ are pure states. Finding (to order r):

$$|\phi_0\rangle = \left[1 - \sum_{q=0}^{n}(p_q + \theta_q^2/2)\right]|\psi_n\rangle + \sum_{q=0}^{n}\sum_{P \neq I}(i\theta_q h_{q,P} + d_{q,P})|\phi_n(P,q)\rangle - \tag{57}$$

$$- \sum_{q<q'}\sum_{P,Q \neq I}\theta_q \theta_{q'} h_{q,P} h_{q',Q}|\phi_n(P,q;Q,q')\rangle$$

$|\phi_0^j\rangle$ is similar, but with the sums taken only over $q \neq j$. Then $$\langle \psi_n|\rho_0|\psi_n\rangle = |\langle\psi_n|\phi_0\rangle|^2 = \tag{58}$$

$$1 - \sum_{q=0}^{n}(2p_q + \theta_q^2) + \sum_{q=0}^{n}\sum_{P \neq I}[(i\theta_q h_{q,P} + d_{q,P})\langle\psi_n|\phi_n(P,q)\rangle + c.c.] +$$

$$+ \left|\sum_{q=0}^{n}\sum_{P \neq I}\theta_q h_{q,P}\langle\psi_n|\phi_n(P,q)\rangle\right|^2 -$$

$$2\sum_{q<q'}\sum_{P,Q \neq I}\theta_q \theta_{q'} \operatorname{Re}(h_{q,P}h_{q,Q}\langle\psi_n|\phi_n(P,q;Q,q')\rangle).$$

Now, the circuits $Q_n$ and $Q_n(P,q)$ both have the same sequence of unitaries $U_{q+1}, \ldots, U_n$ after location q, and $|\phi_k(P,q)\rangle = P|\psi_q\rangle$, so $$\langle\psi_n|\phi_n(P,q)\rangle = \langle\psi_q|P|\psi_q\rangle \tag{60}$$

and $\langle\phi_n(P,q)|\psi_n\rangle = \langle\psi_q|P^\dagger|\psi_q\rangle$. By reordering the sums, yields:

$$\sum_{P \neq I} h_{q,P}\langle\psi_n|\phi_n(P,q)\rangle = \sum_{P \neq I} h_{q,P^\dagger}\langle\phi_n(P,q)|\psi_n\rangle, \tag{61}$$

and recall that $h_{q,P^\dagger} = h_{q,P}^*$. Thus, $$\langle\psi_n|\rho_0|\psi_n\rangle = 1 - \sum_{q=0}^{n}(2p_q + \theta_q^2) + \sum_{q=0}^{n}\sum_{P \neq I} 2\operatorname{Re}(d_{q,P}\langle\psi_q|P|\psi_q\rangle) + \tag{62}$$

$$+ \left|\sum_{q=0}^{n}\sum_{P \neq I}\theta_q h_{q,P}\langle\psi_q|P|\psi_q\rangle\right|^2 -$$

$$2\sum_{q<q'}\sum_{P,Q \neq I}\theta_q \theta_{q'} \operatorname{Re}(h_{q,P}h_{q',Q}\langle\psi_n|\phi_n(P,q;Q,q')\rangle).$$

This yields the same expression for $\langle\psi_n|\rho_0^j|\psi_n\rangle$, but the sums for q and q' exclude $q=j$ or $q'=j$. Therefore, $$\delta F^j(n,r) = \langle\psi_n|(\rho_0^j - \rho_0)|\psi_n\rangle - \sum_{k \neq 0}\langle\psi_n|\rho_k^j|\psi_n\rangle + o(r) \tag{63}$$

$$= A^j(r) + B^j(n,r) + o(r) \tag{64}$$

$$A^j(r) = 2p_j + \theta_j^2 - \tag{65}$$

$$\sum_{P \neq I}[2\operatorname{Re}(d_{j,P}\langle\psi_j|P|\psi_j\rangle) - \theta_j^2|h_{j,P}|^2|\langle\psi_j|P|\psi_j\rangle|^2] - \sum_{k \neq 0}|\langle\psi_j|A_k|\psi_j\rangle|^2$$

$$B^j(n,r) = 2\sum_{q \neq j}\sum_{P,Q \neq I}\theta_q \theta_j \tag{66}$$

$$\operatorname{Re}(h_{q,P}h_{j,Q}\langle\psi_n|\phi_n'(P,q;Q,j)\rangle - h_{q,P}h_{j,Q}^*\langle\psi_q|P|\psi_q\rangle\langle\psi_j|Q^\dagger|\psi_j\rangle)$$

In this sum, $|\phi_n'(P,q;Q,j)\rangle = |\phi_n(P,q;Q,j)\rangle$ if $q<j$ and $|\phi_n'(P,q;Q,j)\rangle = |\phi_n(Q,j;P,q)\rangle$ if $j<q$.

All terms in $A^j(r)$ are $O(r)$ and only involve sums over constant (e.g., in n) sized domains, so only $B^j(n,r)$ can contribute order b coherent accumulation for $b>0$. There are at most $O(n)$ terms in $B^j(n,r)$, so $b \leq 1$. Those terms scale with r only through the product $\theta_q \theta_j$. Since $\theta_q = O(\sqrt{r})$, the second line will only be linear in r if $\theta_j = \Theta(\sqrt{r})$. Thus, the channel $C_{j,r}$ can have $b>0$ only if $\theta_j^2 = \Theta(r)$. These are exactly the cases in which $C_{j,r}$ allows quadratic accumulation in parallel. Each term in the sum for $B^j(n,r)$ can contribute only if $\theta_q = \Theta(\sqrt{r})$ as well, so $\theta_q^2 = \Theta(r)$ for $\Omega(n^b)$ values of $q \neq j$ are needed.

Noticing that:

$$F(n,r) = 1 - \sum_j A^j(r) - \frac{1}{2}\sum_j B^j(n,r). \tag{67}$$

If $b_{max}$ is the maximum value of b for any channel in the set, then $|B^j(n,r)| = O(n^{b_{max}})$, which implies $G(n) = O(n^{b_{max}+1})$.

Now that a general overview for definitions and formulas to study more general circuits have been described, a protocol for testing for coherent errors in state preparation is discussed below.

Example 7: Measuring Contribution to Accumulation

Theorem (4) shows that to identify if a channel can contribute non-trivial coherent accumulation in some family of circuits, it is sufficient to check if it does so in parallel. However, there are circumstances in which this is not possible. State preparation illustrates one such case: The channel only appears in conjunction with a particular element (e.g., state preparation), which cannot be placed where needed to run the usual maximally sensitive states protocol. There are other cases of interest too, for instance if studying the noise on a single qubit but unable to do repeated measurement as in Example 2(2). Or one might be interested in determining not just whether a particular channel can exhibit contribute coherent accumulation, but if it contributes coherently in a specific circuit family.

The basis of tests in the present disclosure will be definition (4) and equation (64). The basic idea is that one can use randomized compiling to selectively twirl different channels, separately twirling the particular channel to study from other possible noise channels that it can accumulate with. By comparing the four possibilities of which channels are twirled, one can determine whether the channel of interest is contributing to accumulation.

Example 7(1): Testing State Preparation

To measure the potential for noise in state preparation to contribute coherent accumulation, a situation in which the coherent noise in the state preparation step combines with coherent noise elsewhere in the circuit is desired. One difficulty is that necessarily knowing which channels are present in the natural noise in the system is uncertain, and even this was certain, one does not know under what circumstances one will be able to interfere constructively with the channel one is trying to test. Therefore, in order to guarantee detection of all possible coherent noise in the state preparation, one must add noise of a particular type deliberately.

A nested circuit family is desired. Thus, keeping the circuits used as simple as possible is desired. Accordingly, the present disclosure simply prepares a $|0\rangle$ state, waits for n time steps, and then measures in the standard basis, but sometimes also adds artificial noise, a rotation $\exp(i\phi \vec{w} \cdot \vec{\sigma})$, after each time step. Thus, one can assume that the naturally occurring noise during the waiting time is negligible, and that all the naturally occurring noise is in the state preparation and measurement. In particular, the present disclosure also assumes that there is no noise in the rotations, but the result is not at all sensitive to this assumption. To check for coherent errors in the preparation, but not in the measurement, one will always twirl the measurement: With probability ½ do to the circuit as above, and with probability ½ do the circuit but with a Z just before the measurement. The noisy twirled measurement, as discussed above, can be modeled as a channel $\mathcal{D}$ followed by a perfect measurement.

Let $Q_n$ be the family of circuits consisting of perfect $|0\rangle$ state preparation followed by n time steps of waiting. $\{Q_n\}$ is then a nested circuit family. Let $C_{0,r}$ be the noise on state preparation. Then the circuit without artificial noise is $Q_n(C_{0,r}, 0; \mathcal{D}., n)$ followed by perfect measurement, which is projection on the state $|0\rangle$ and its complement. This circuit thus exactly measures the fidelity of $\rho_n(C_{0,r}, 0; \mathcal{D}, n)$ to $|\psi_0\rangle = |0\rangle$. Let $C_{q,r}$ be the unitary $\exp(i\phi \vec{w} \cdot \vec{\sigma})$ for $q=1, \ldots$ n−1 and $C_{n,r}$ be $\exp(i\phi \vec{w} \cdot \vec{\sigma})$ followed by $\mathcal{D}$.

Now, apply equation (64) to $\{Q_n\}$ and $\{C_{q,r}\}$. The framework of Example (6) does not perfectly fit here, since a fixed sequence of channels for all n is not obtained—the nth channel is treated differently since it has the noise $\mathcal{D}$ added. However, this does not matter—theorem 4 still describes the conditions under which $C_{0,r}$ can contribute linear coherent accumulation and equation (64) still applies to the particular circuit and channels obtained.

The location of interest is j=0, so let $\theta_j=0$ be the coherent rotation angle for the noise $C_{0,r}$ during state preparation, and $\theta_q=\phi$ for $j\neq 0$. Since $\mathcal{D}$ is twirled, this is true also for q=n. Via working with a qubit, the $h_{q,P}$ are real, and because Z errors during preparation of $|0\rangle$ are meaningless, $h_{0,Z}=0$. For $q\neq 0$, $h_{q,P}=w_P$. Since $|\psi_0\rangle = |0\rangle$, $\langle \psi_0|P|\psi_0\rangle = 0$ for P=X, Y, the only cases that matter. Therefore, all the potentially non-constant contribution to $\delta F^0(n,r)$ in this case will come from the term involving $\langle \psi_n|\phi_n'(P,q;Q,j)\rangle$.

Now, $|\phi_n(Q,0;P,q)\rangle = PQ|0\rangle$. If P=Q, then PQ=I. Otherwise, PQ=±iR, where R is the third Pauli. When R=X, Y, then $\langle 0|PQ|0\rangle = 0$, so only consider the cases when P=Q or R=Z. That is, having obtained P=Q=X, P=Q=Y, P=X and Q=Y, and P=Y and Q=X. The cases where R=Z give something imaginary, and will not contribute to the real part.

The $A^j(r)$ term in equation (64) is independent of n. Thus:

$$\delta F^0(n, r) = n\theta\phi \sum_{P, Q\neq I} w_P h_{0,Q} \mathrm{Re}\langle 0|\phi_n(Q, 0; P, q)\rangle + A^j(r) + o(r) \quad (68)$$

$$= n\theta\phi(w_X h_{0,X} + w_Y h_{0,Y}) + \delta F^0(0, r) + o(r). \quad (69)$$

Therefore if running some circuits with $w_X=1$ and some circuits with $w_Y=1$, one can pick out the $h_{0,X}$ and $h_{0,Y}$ components of the noise on the state preparation.

At least, one could if implementing both $Q_n^\phi = Q_n(C_{0,r}, 0; C_{1,r}, 1; \ldots; C_{n,r}, n)$ and $Q_n^{0,\phi} = Q_n(C_{1,r}, 1; \ldots; C_{n,r}, n)$ followed by perfect measurement was obtainable. One can do $Q_n^\phi$: this is what is obtained by creating the $|0\rangle$ state using noisy state preparation and following by n time steps of rotations, then a twirled noisy measurement. However, one cannot do $Q_n^{0,\phi}$, since that would require a perfect (noise-free) state preparation.

Instead, $Q_n^{t,\phi} = Q_n(C^t, 0; C_{1,r}, 1; \ldots; C_{n,r}, n)$, where $C^t$ is the noise channel obtained by twirling the state preparation (e.g., with probability ½ after preparing the state, do Z; otherwise nothing). Let $\rho_{n,r}^t$ be the output of $Q_n^{t,\phi}$ and let $\delta F^t(n,r) = \langle 0|(\rho_{n,r}^0 - \rho_{n,r}^t)|0\rangle$ and $\Delta_t(n) = \lim_{r\to 0} \delta F^t(n,r)/r$. $C^t$ has no coherent part and cannot contribute coherent accumulation, so $\Delta_t(n)$ is guaranteed to be at most constant in n. Then for $Q_n^{0,\phi}$:

$$\delta F^0(n,r) = \langle 0|(\rho_{n,r}^0 - \rho_{n,r}^t) + (\rho_{n,r}^t - \rho_{n,r})|0\rangle \quad (70)$$

$$= \delta F^t(n,r) + \langle 0|(\rho_{n,r}^t - \rho_{n,r})|0\rangle. \quad (71)$$

Since $\langle 0|\rho_{n,r}^t|0\rangle$ is the probability $P_n^t$ that $Q_n^{t,\phi}$ outputs 0 and $\langle 0|\rho_{n,r}|0\rangle$ is the probability $P_n$ that $Q_n^\phi$ outputs 0, the last terms are measurable. The remaining term $\delta F^t(n,r)$ is not directly measurable, but the $\Theta(r)$ part of that must be constant in n. In particular, if $P_n^t - P_n$ increases linearly with n, the cause must be (subject to our approximations) that the state preparation contributes to linear accumulation.

In order to eliminate the $\delta F^t(n,r)$ term and determine whether the linear accumulation is actually present or not, one can also measure $P_0^t - P_0$. In particular:

$$(P_n^t - P_n) - (P_0^t - P_0) = [\delta F^0(n,r) - \delta F^0(0,r)] + [\delta F^t(0,r) - \delta F^t(n,r)] + o(r) \quad (72)$$

$$= n\theta\phi(w_X h_{0,X} + w_Y h_{0,Y}) + o(r). \quad (73)$$

One can determine the parameters of the noise on the state preparation by simply dividing by no. To determine additional confidence that the behavior is actually proportional to n, one could measure additional values of n.

Putting this all together provides the following protocol:

Protocol (4): [Measure coherent errors in state preparation]. Choose n and $\phi$ as desired, provided $n\phi \ll 1$ still in the limit of small r. Subject to this constraint, larger no will make a larger signal $P_{n,X}^t$ and $P_{n,Y}^t$.

1. Perform $Q_0^{t,\phi}$ (prepare the state $|0\rangle$ and measure immediately, twirling both preparation and measurement), which has output 0 with probability $P_0^t$.
2. Perform $Q_0^\phi$ (prepare and measure immediately, twirling only measurement), which has output 0 with probability $P_0$.
3. Perform $Q_n^{t,\phi}$ using $w_X=1$ and $w_Y=0$, which has output 0 with probability $P_{n,X}^t$ and again using $w_X=0$, $w_Y=1$, which has output 0 with probability $P_{n,Y}^t$.
4. Perform $Q_n^\phi$ using $w_X=1$ and $w_Y=0$, which has output 0 with probability $P_{n,X}$ and again using $w_X=0$, $w_Y=1$, which has output 0 with probability $P_{n,Y}$.
5. Calculate $$\theta h_{0,X} = [(P_{n,X}^t - P_{n,X}) - (P_0^t - P_0)]/(n\phi), \quad (74)$$

$$\theta h_{0,Y} = [(P_{n,Y}^t - P_{n,Y}) - (P_0^t - P_0)]/(n\phi). \quad (75)$$

$|h_{0,X}|^2 + |h_{0,Y}|^2 = 1$, so this tells us $\theta$, $h_{0,X}$ and $h_{0,Y}$.

Thus, one embodiment in accordance with protocol (4) of the present disclosure provides a method, nontransitory computer readable media and/or a computer system that identifies coherent error or evolution of interest by sending a first set of gates to a first qudit of a quantum system. The first set of gates prepare the first qubit in a predetermined basis state, and measure the first qudit. Moreover, the gates in the first set of gates for preparing the first qudit in the predetermined basis state are twirled, and the gates in the first set of gates that measure the first qudit are twirled. The method, nontransitory computer readable media and/or a computer system further repeats the sending the first set of gates a plurality of times (e.g., two or more times, 10 or more times, 100 or more times, 1000 or more times, 10,000 or more times, 100,000 or more times), thus determining a probability ($P_o^t$) of a first predetermined output. The method, nontransitory computer readable media and/or a computer system further sends a second set of gates to the first qudit. The second set of gates prepare the first qudit, and measure the first qudit, such that only the gates in the second set of gates for measurement of the first qudit are twirled. For this, the method, nontransitory computer readable media and/or a computer system includes instructions for repeating the sending the second set of gate a plurality of times (e.g., two or more times, 10 or more times, 100 or more times, 1000 or more times, 10,000 or more times, 100,000 or more times), thus determining a probability $P_o$ of a second predetermined output. Moreover, the method, nontransitory computer readable media and/or a computer system sends a third set of gates to the first qudit. The third set of gates: prepare the first qudit; perform a set of n rotations using $w_X=1$ and $w_Y=0$, in which n is a positive integer; and measure the first qudit, such that the gates in the third set of gates for preparing the first qudit are twirled, the gates for measuring the first qudit are twirled, and the gates for performing the set of n rotations are not twirled. Furthermore, the method, nontransitory computer readable media and/or a computer system repeats the sending the third set of gates a plurality of times (e.g., two or more times, 10 or more times, 100 or more times, 1000 or more times, 10,000 or more times, 100,000 or more times), thus determining a probability ($P_{n,X}^t$) of a third predetermined output. The method, nontransitory computer readable media and/or a computer system further sends a fourth set of gates to the first qudit. The fourth set of gates prepare the first qudit. Moreover, the fourth set of gates perform a set of n rotations using $w_X=0$ and $w_Y=1$, wherein n is a positive integer. In addition, the fourth set of gates measure the first qudit, in which the gates in the fourth set of gates for preparing the first qudit are twirled, the gates for measuring the first qudit are twirled, and the gates for performing the set of n rotations are not twirled. method, nontransitory computer readable media and/or a computer system repeat the sending the fourth set of gates a plurality of times (e.g., two or more times, 10 or more times, 100 or more times, 1000 or more times, 10,000 or more times, 100,000 or more times), thus determining a probability ($P_{n,Y}^t$) of a fourth predetermined output. Moreover, the method, nontransitory computer readable media and/or a computer system send a fifth set of gates to the first qudit. The fifth set of gates prepare the first qudit. The fifth set of gates also perform a set of n rotations using $w_X=1$ and $w_Y=0$. Moreover, the fifth set of gates measure the first qudit, in which gates in the fifth set of gates for preforming the measurement are twirled and the remaining gates in the fifth set of gates are not twirled. The method, nontransitory computer readable media and/or a computer system further repeat the sending the fifth set of gates a plurality of times (e.g., two or more times, 10 or more times, 100 or more times, 1000 or more times, 10,000 or more times, 100,000 or more times), thus determining a probability ($P_{n,X}^t$) of a fifth predetermined output. Furthermore, the method, nontransitory computer readable media and/or a computer system send a sixth set of gates to the first qudit. The sixth set of gates prepare the first qudit. The sixth set of gates further perform a set of n rotations using $w_X=0$ and $w_Y=1$. Moreover, the sixth set of gates measure the first qudit, in which the gates in the sixth set of gates for preforming the measurement are twirled and the remaining gates in the sixth set of gates are not twirled. The method, nontransitory computer readable media and/or a computer system repeats the sending the sixth set of gates a plurality of times (e.g., two or more times, 10 or more times, 100 or more times, 1000 or more times, 10,000 or more times, 100,000 or more times), thus determining a probability ($P_n$,Y) of a sixth predetermined output. Furthermore, the method, nontransitory computer readable media and/or a computer system uses the probabilities: $P_o^t$; $P_o$; $P_{n,X}^t$; $P_{n,Y}^t$; $P_{n,X}$; and $P_{n,Y}$ to determine a coherent error or evolution of the state preparation of the first qudit.

Note that if the $\phi$ angle rotations are slightly noisy, then a slightly different circuit is obtained than expected: $Q_n$ ($C_{0,r}$,0; $C_{1,r}$',1; . . . ; $C_{n,r}$',n) with $C_{q,r}$'. a channel close to the desired $C_{q,r}$. The analysis above still holds almost unchanged, but $\phi$, $w_X$, and $w_Y$ might be slightly off from the desired values. This translates into an error in $h_{0,X}$ and $h_{0,Y}$, but provided the error in the rotation is small, the deduced values will be close to correct. In principle, one can perform a single rotation by angle $n\phi$ instead of n rotations by an angle φ, but in the case where these rotations are noisy, this might result in a deviation from the desired behavior if the noise cannot be evenly divided up among n separate smaller rotations. This effect will be particularly pronounced if trying different values of n to compare and if rotations by the different angles also have substantially different errors; if the noise on the nφ rotation does not scale linearly with n, this may largely or completely obscure the signal one is trying to see.

Essentially the same procedure can be used with measurement to provide an alternate way of testing for quadratic accumulation of errors during measurement, and a related but slightly more complicated protocol can test for quadratic accumulation of errors in gates. The protocol for measurement is almost identical to that for state preparation but always twirls the state preparation and either twirls or does not twirl the measurement. The protocol for gates uses an initial Bell state with an ancilla qubit to ensure that all of X, Y, and Z can be tested and that only errors that cancel with later errors from the artificial noise will contribute to $B^j(n,r)$ in equation (64). Compared to the technique from Example (5), these protocols are simpler, using just a single qubit, or 2t for testing t-qubit gates, with no need for reusing qubits or making multiple measurements in the course of the circuit. However, since the error to be measured only appears once in the circuits and subtracting two very similar small quantities, one will need many more iterations of the testing circuits from this section in order to accumulate sufficient statistics to determine if the gate can contribute coherent accumulation or not.

Example 7(2): Accumulation in a Specific Circuit Family

An advantage about the protocol for testing noise in state preparation is that it is not really dependent on seeing a scaling with n. The present disclosure simply compares the n=0 case to a single n≠0 case and determines if there is a difference. Inspired by this, the present disclosure can use a similar protocol to determine if a specific location, which could be a gate, a state preparation, or a measurement, in a specific circuit has errors which add coherently with other errors in that circuit. Since a family of circuits is not had and cannot scale to larger n, definition (4) does not actually apply in this case, but conceptually, things are expected to behave similarly.

In particular, consider the following protocol:

Protocol (5): [Identify if errors in a particular location add coherently in a circuit].
1. Run the circuit $Q^{j,T}$ with randomized compiling for both location j and the set of all locations T that might be experiencing coherent noise. Note the output distribution $X^{j,T}$.
2. Run the circuit $Q^T$ where the location j is not twirled but all other possible coherent noise locations are. The output distribution is $X^T$.
3. Compute the fidelity $F^{j,T}$ between $X^T$ and $X^{j,T}$; this sets a baseline of comparison for how much difference twirling makes on the noise in location j in isolation.
4. Run the circuit $Q^j$ using randomized compiling on location j but nowhere else. The output distribution is $X^j$. Compute the fidelity $F^j$ between $X^j$ and $X^T$.
5. Run the circuit Q not using randomized compiling anywhere. The output distribution is X. Compute the fidelity F between X and $X^T$.
6. Let $\Delta F = F^j - F$. If $\Delta F \gg 1 - F^{j,T}$, then conclude that the location j is contributing to greater than linear accumulation.

Thus, in accordance with protocol (5), one aspect of the present disclosure provides methods, nontransitory computer readable media, and/or computer systems that determine whether a qudit location in a quantum system is contributing to a coherent noise of the quantum system. The methods, nontransitory computer readable media, and/or computer systems run circuit $Q^{j,T}$ with randomized compiling for both qudit location j and a plurality of qudit locations T within the quantum system. Qudit location j and the plurality of qudit locations T collectively consist of the qudit locations within the quantum system that are susceptible to coherent noise, with an output distribution $X^{j,T}$. In practice, to realize this distribution, the circuit $Q^{j,T}$ is run a plurality of times (e.g., 10 or more times, 100 or more times, 1000 or more times, 10,000 or more times, 100,000 or more times, or 1 million or more times) in some embodiments. The methods, nontransitory computer readable media, and/or computer systems run the circuit $Q^T$, in which the qudit location j is not twirled but the plurality of qudit locations T are twirled, with output distribution $X^T$. In practice, to realize distribution $X^T$, the circuit $Q^T$ is run a plurality of times (e.g., 10 or more times, 100 or more times, 1000 or more times, 10,000 or more times, 100,000 or more times, or 1 million or more times) in some embodiments. Moreover, the methods, nontransitory computer readable media, and/or computer systems compute the fidelity $F^{j,T}$ between $X^T$ and $X^{j,T}$, thus setting a baseline of comparison for a difference twirling makes on the noise in qudit location j in isolation. Furthermore, the methods, nontransitory computer readable media, and/or computer systems run the circuit $Q^j$ using randomized compiling on location j but on no other qudit within the quantum system with output distribution $X^j$. In practice, to realize this distribution, the circuit $Q^j$ is run a plurality of times (e.g., 10 or more times, 100 or more times, 1000 or more times, 10,000 or more times, 100,000 or more times, or 1 million or more times) in some embodiments. Also, the methods, nontransitory computer readable media, and/or computer systems compute the fidelity $F^j$ between $X^j$ and $X^T$. The methods, nontransitory computer readable media, and/or computer systems run the circuit Q without any randomized compiling with output distribution X. In practice, to realize distribution X, the circuit Q is run a plurality of times (e.g., 10 or more times, 100 or more times, 1000 or more times, 10,000 or more times, 100,000 or more times, or 1 million or more times) in some embodiment. Additionally, the methods, nontransitory computer readable media, and/or computer systems compute the fidelity F between X and $X^T$. Furthermore, the methods, nontransitory computer readable media, and/or computer systems determine, when $F^j - F$ is greater than $1 - F^{j,T}$, that qudit location j is contributing coherent noise to the quantum system.

The idea is that twirling the location j may change how it contributes to the overall error in the circuit, but not by very much unless it can constructively interfere with noise coming from other locations. If location j is not coherent with the noise from other locations, the error it creates should be more or less independent of the other errors in the circuit and $\Delta F$ will be about the same as $1 - F^{j,T}$. On the other hand, if there is greater than linear accumulation, that will be present in Q and the overall error rate will be substantially higher than in $Q^j$.

One can further refine this protocol and obtain some information about what the actual accumulation is (i.e., whether it is quadratic or something smaller but still superlinear) by twirling not all of T but subsets of different sizes. Then one can look at the scaling of ΔF as the untwirled subset of T gets larger.

Accordingly, the present disclosure provides an efficient protocol to test for coherent errors in a system. For coherent noise with worst-case fidelity r, the present disclosure can detect the presence of the noise using only $O(1/\sqrt{r})$ qubits and operations. For qubits, the protocol allows for complete characterization of the coherent part of the error in the channel with a similar number of qubits, whereas for higher-dimensional qudits, one can only learn partial information about the coherent part of the channel. These protocols of the present disclosure are within a constant factor (e.g., dependent only on the qudit dimension) of the optimal sensitivity to coherent noise, and can thus identify very small errors with considerably fewer resources than protocols which do not explicitly utilize the quadratic scaling of coherent errors. In general, the protocol is quite efficient, using O(n) gates with small constant factors and straightforward classical processing.

The protocol of the present disclosure requires either construction of an n-qubit entangled state for modest size n or two qubits (e.g., 4 if measuring the noise in a two-qubit gate) and n−1 repetitive measurements and resets of one of those qubits during the circuit. How large an n is needed depends on the size of the errors and the amount of statistics one is willing to collect, but a modest size n, perhaps on the order of 10, should be enough to distinguish quadratic accumulation of errors from linear accumulation. The present disclosure also provides an alternative protocol that requires even fewer capabilities and can detect coherent errors in state preparation, but is less sensitive, requiring more statistics to see an effect.

Both protocols are robust to small variations in the coherent errors from gate to gate, but when gate errors vary substantially when the same gate is performed on different qubits, the n-qubit version of the maximally sensitive states protocol breaks down. However, the version resetting and reusing one of the qubits (e.g., Example 2(2)) continues to work without change to detect coherent noise on the gate on the qubit being reset. The protocol of Example (7) also works unchanged in this situation.

The present disclosure operates in the limit r→0 in order to have a well-defined theoretical framework for talking about the dominant error. What does this mean in practice, for some fixed noise model? Generally, as n varies, one can expect to have a term linear in n and a term quadratic in n, with the latter being the signal of interest in here and everything else contributing to the linear term. In order to see the signal, the coefficient of the quadratic term is needed to be at least about 1/n as large as the coefficient of the linear term. So for instance, if working with roughly 10 qubits, one can hope to see the quadratic term even if the effect of coherent errors is roughly 1/10 the size of the stochastic errors on a single qubit. This is the advantage of working with maximally sensitive states: the small coherent terms are enhanced in size. The limits of this are corrections of order $r^2$ compared to the signal of order r, plus the scaling will break down once $n^2r$ becomes of order 1, so that sets an upper limit to how large an n can be used. In this same case of approximately 10 qubits, one would expect the protocol to work as long as r≤0.01.

There remain a number of open questions, particularly relating to qudits with dimension d>2. One question is how to completely characterize the coherent part of a channel for qudits. Another is how many states are needed. The most efficient maximally sensitive sets presented by the present disclosure take advantage of MUBs, and use d+1 states. It seems likely this is the best possible, though that remains an open question as well, but complete sets of MUBs are only known to exist when d is a prime power. It is unclear if more states are needed in other dimensions, or if other constructions can achieve similar scaling.

Another open question is the characterization of measurements for qudits. Noisy qubit measurements are two-outcome POVMs, which have a simple form, but multiple-outcome POVMs are significantly more complicated and may need ancillas to implement.

Perhaps a more critical question is what happens to this protocol when the assumptions about the noise are not satisfied. The present disclosure illustrates that small variation in the coherent error from qubit to qubit is not too important, but what if there are non-Markovian errors in the other gates? What if the errors in the Paulis used for twirling are not negligible? It is plausible that some signal will remain in these cases, but it may well be partially masked by other sources of coherent errors that overcome the randomized compiling. Leakage errors are another interesting case. If each qubit is leaking into a separate environment, this is effectively a stochastic error and errors on different qubits cannot accumulate coherently (although they could due to multiple gates on the same qubit). However, coherent leakage of information into a shared environment might allow quadratic accumulation of error that does not show up in this protocol.

REFERENCES CITED AND ALTERNATIVE EMBODIMENTS

All references cited herein are incorporated herein by reference in their entirety and for all purposes to the same extent as if each individual publication or patent or patent application was specifically and individually indicated to be incorporated by reference in its entirety for all purposes.

The present invention can be implemented as a computer program product that comprises a computer program mechanism embedded in a non-transitory computer readable storage medium. These program modules can be stored on a CD-ROM, DVD, magnetic disk storage product, USB key, or any other non-transitory computer readable data or program storage product.

Many modifications and variations of this invention can be made without departing from its spirit and scope, as will be apparent to those skilled in the art. The specific embodiments described herein are offered by way of example only. The embodiments were chosen and described in order to best explain the principles of the invention and its practical applications, to thereby enable others skilled in the art to best utilize the invention and various embodiments with various modifications as are suited to the particular use contemplated. The invention is to be limited only by the terms of the appended claims, along with the full scope of equivalents to which such claims are entitled.

What is claimed is:

1. A computer system for identifying coherent error or evolution of interest, the computer system comprising:
 at least one processor; and
 a memory storing at least one program for execution by the at least one processor, the at least one program comprising instructions for:
 (A) for a respective value for n that is a positive integer, performing an outer procedure comprising:
 for each respective state in a plurality of states, wherein the plurality of states is sufficient to represent all coherent error or evolution of interest in a quantum system, performing an inner procedure comprising:
- (i) creating a copy of the respective state using randomized compiling, wherein the respective state entangles n qudits of the quantum system; and
- (ii) obtaining one or more measurements of the n qudits in a measurement basis that corresponds to the plurality of states;

(B) forming a respective outcome bit string for the respective state from each measurement of each qudit in the n qudits;

(C) repeating (A) and (B) a number of times thereby obtaining a corresponding plurality of outcome bit strings for each respective state in the plurality of states;

(D) determining an error rate for each respective state using the corresponding plurality of outcome bit strings for the respective state for the respective value n;

(E) repeating (A) through (D) for each different n drawn from a plurality of positive integers thereby determining an error rate for each respective state for each respective value n in a plurality of values n;

(F) for each respective state S in the plurality of states, fitting the error rate for each respective value n in a plurality of values n obtained for the respective state to a corresponding quadratic function in which the error rate is the dependent variable and n is the independent variable; and (G) using at least the coefficient for the highest term in each corresponding quadratic function of each respective state to quantify a parameter of the coherent error or evolution of interest.

2. The computer system of claim 1 wherein the coherent error or evolution of interest is coherent error in the noise channel for a single-qudit gate F.

3. The computer system of claim 2, wherein
the plurality of qudits is a plurality of qubits, and
F is a single-qubit Clifford group gate.

4. The computer system of claim 3, wherein the inner procedure further comprises, between the creating (i) and obtaining (ii):
- (i.1) applying $PF^\dagger Q$ to each qudit in the n qudits, wherein P is a random Pauli gate, F is perfect unitary gate, $F^\dagger$ is F twirled, and Q is $FPF^\dagger$;
- (i.2) applying F to each qudit in the n qudits.

5. The computer system of claim 4 wherein the plurality of states is a maximally sensitive set of states.

6. The computer system of claim 5, wherein
the maximally sensitive set of states consists of $|\psi_{n,X}\rangle$, $|\psi_{n,Y}\rangle$, and $|\psi_{n,Z}\rangle$, and
a measurement basis that corresponds to the plurality of states is the Z basis when the respective state is of $|\psi_{n,X}\rangle$ or $|\psi_{n,Y}\rangle$ and the X basis when the respective state is $|\psi_{n,Z}\rangle$.

7. The computer system of claim 4, wherein the obtaining the one or more measurements (A)(ii) comprises obtaining a separate measurement of each qudit in the n qudits in the measurement basis that corresponds to the plurality of states.

8. The computer system of claim 1, wherein the corresponding quadratic function has the form $a_S n^2 + b_S n + c$ = measured error rate, wherein a, b, and c are fitted coefficients.

9. The computer system of claim 8, wherein
the plurality of qudits is a plurality of qubits, and
the coherent error or evolution of interest is coherent error in the noise channel for a single-qudit gate F,
the parameter of the coherent error is $\theta^2 = a_X + a_Y + a_Z$,
the plurality of states is a maximally sensitive set of states consisting of $|\psi_{n,X}\rangle$, $|\psi_{n,Y}\rangle$, and $|\psi_{n,Z}\rangle$,
$a_X$ is the a coefficient for the corresponding quadratic function for $|\psi_{n,X}\rangle$,
$a_Y$ is the a coefficient for the corresponding quadratic function for $|\psi_{n,Y}\rangle$, and
$a_Z$ is the a coefficient for the corresponding quadratic function for $|\psi_{n,Z}\rangle$.

10. The computer system of claim 8, wherein the at least one program further comprises instructions for calculating $$v_S^2 = \frac{a_P}{\theta^2},$$

wherein $a_P$ is one of $a_X$, $a_Y$, and $a_Z$.

11. The computer system of claim 1, wherein the coherent error or evolution of interest is coherent error in measurement using the quantum system.

12. The computer system of claim 11, wherein
the plurality of qudits is a plurality of qubits,
the plurality of states consists of $|\psi_{n,X}\rangle$ and $|\psi_{n,Y}\rangle$, and
the measurement basis is the Z basis.

13. The computer system of claim 12, wherein
the corresponding quadratic function has the form $aSn^2 + bSn + c$ = measured error rate, wherein a, b, and c are fitted coefficients,
the parameter of the coherent error is $\theta^2 = a_X + a_Y$,
$a_X$ is the a coefficient for the corresponding quadratic function for $|\psi_{n,X}\rangle$, and
$a_Y$ is the a coefficient for the corresponding quadratic function for $|\psi_{n,Y}\rangle$.

14. The computer system of claim 13, wherein the at least one program further comprises instructions for calculating $$v_S^2 = \frac{a_P}{\theta^2},$$

wherein $a_P$ is one of $a_X$ and $a_Y$.

15. The computer system of claim 1, wherein the creating the copy of the respective state entangles all n qudits of the quantum system at the same time.

16. The computer system of claim 1, wherein the plurality of qudits consists of two qudits and the creating the copy of the respective state using randomized compiling entangles the plurality of qudits sequentially after resetting a first qudit in the pair of qudits.

17. A method for identifying coherent error or evolution of interest, the method performed at a computer system comprising at least one processor and a memory storing at least one program for execution by the at least one processor, the method comprising:
(A) for a respective value for n that is a positive integer, performing an outer procedure comprising:
for each respective state in a plurality of states, wherein the plurality of states is sufficient to represent all coherent error or evolution of interest in a quantum system, performing an inner procedure comprising:
- (i) creating a copy of the respective state using randomized compiling, wherein the respective state entangles n qudits of the quantum system; and
- (ii) obtaining one or measurements of the n qudits in a measurement basis that corresponds to the plurality of states;

(B) forming a respective outcome bit string for the respective state from each measurement of each qudit in the n qudits;

(C) repeating (A) and (B) a number of times thereby obtaining a corresponding plurality of outcome bit strings for each respective state in the plurality of states;

(D) determining an error rate for each respective state using the corresponding plurality of outcome bit strings for the respective state for the respective value n;

(E) repeating (A) through (D) for each different n drawn from a plurality of positive integers thereby determining an error rate for each respective state for each respective value n in a plurality of values n;

(F) for each respective state S in the plurality of states, fitting the error rate for each respective value n in a plurality of values n obtained for the respective state to a corresponding quadratic function in which the error rate is the dependent variable and n is the independent variable; and (G) using at least the coefficient for the highest term in each corresponding quadratic function of each respective state to quantify a parameter of the coherent error or evolution of interest.

18. A non-transitory computer readable storage medium storing one or more programs, the one or more programs comprising instructions, which when executed by a computer system with one or more processors, cause the computer system to perform a method comprising:

(A) for a respective value for n that is a positive integer, performing an outer procedure comprising:
  for each respective state in a plurality of states, wherein the plurality of states is sufficient to represent all coherent error or evolution of interest in a quantum system, performing an inner procedure comprising:
    (i) creating a copy of the respective state using randomized compiling, wherein the respective state entangles n qudits of the quantum system; and
    (ii) obtaining one or more measurements of the n qudits in a measurement basis that corresponds to the plurality of states;

(B) forming a respective outcome bit string for the respective state from each measurement of each qudit in the n qudits;

(C) repeating (A) and (B) a number of times thereby obtaining a corresponding plurality of outcome bit strings for each respective state in the plurality of states;

(D) determining an error rate for each respective state using the corresponding plurality of outcome bit strings for the respective state for the respective value n;

(E) repeating (A) through (D) for each different n drawn from a plurality of positive integers thereby determining an error rate for each respective state for each respective value n in a plurality of values n;

(F) for each respective state S in the plurality of states, fitting the error rate for each respective value n in a plurality of values n obtained for the respective state to a corresponding quadratic function in which the error rate is the dependent variable and n is the independent variable; and (G) using at least the coefficient for the highest term in each corresponding quadratic function of each respective state to quantify a parameter of the coherent error or evolution of interest.

19. A computer system for identifying coherent error or evolution of interest, the computer system comprising:
at least one processor; and
a memory storing at least one program for execution by the at least one processor, the at least one program comprising instructions for:

(A) sending a first set of gates to a first qudit of a quantum system, wherein the first set of gates (i) prepare the first qubit in a predetermined basis state, and (ii) measure the first qudit, wherein the gates in the first set of gates for preparing the first qudit in the predetermined basis state are twirled, and the gates in the first set of gates that measure the first qudit are twirled;

(B) repeating (A) a plurality of times thereby determining a probability ($P_o^t$) of a first predetermined output;

(C) sending a second set of gates to the first qudit, wherein the second set of gates (i) prepare the first qudit, and (ii) measure the first qudit, wherein only the gates in the second set of gates for measurement of the first qudit are twirled;

(D) repeating (C) a plurality of times thereby determining a probability $P_o$ of a second predetermined output;

(E) sending a third set of gates to the first qudit, wherein the third set of gates (i) prepare the first qudit, (ii) perform a set of n rotations using $w_X=1$ and $w_Y=0$, wherein n is a positive integer, and (iii) measure the first qudit, wherein the gates in the third set of gates for preparing the first qudit are twirled, the gates for measuring the first qudit are twirled, and the gates for performing the set of n rotations are not twirled;

(F) repeating (E) a plurality of times thereby determining a probability ($P_{n,X}^t$) of a third predetermined output;

(G) sending a fourth set of gates to the first qudit, wherein the fourth set of gates (i) prepare the first qudit, (ii) perform a set of n rotations using $w_X=0$ and $w_Y=1$, wherein n is a positive integer, and (iii) measure the first qudit, wherein the gates in the fourth set of gates for preparing the first qudit are twirled, the gates for measuring the first qudit are twirled, and the gates for performing the set of n rotations are not twirled;

(H) repeating (G) a plurality of times thereby determining a probability ($P_{n,Y}^t$) of a fourth predetermined output;

(I) sending a fifth set of gates to the first qudit, wherein the fifth set of gates (i) prepare the first qudit, (ii) perform a set of n rotations using $w_X=1$ and $w_Y=0$, and (iii) measure the first qudit, wherein the gates in the fifth set of gates for preforming the measurement are twirled and the remaining gates in the fifth set of gates are not twirled;

(J) repeating (I) a plurality of times thereby determining a probability ($P_{n,X}$) of a fifth predetermined output;

(K) sending a sixth set of gates to the first qudit, wherein the sixth set of gates (i) prepare the first qudit, (ii) perform a set of n rotations using $w_X=0$ and $w_Y=1$, (iii) and measure the first qudit, wherein the gates in the sixth set of gates for preforming the measurement are twirled and the remaining gates in the sixth set of gates are not twirled;

(L) repeating (K) a plurality of times thereby determining a probability ($P_{n,Y}$) of a sixth predetermined output; and (M) using the probabilities $P_o^t$, $P_o$, $P_{n,X}^t$, $P_{n,Y}^t$, $P_{n,X}$, and $P_{n,Y}$ to determine a coherent error or evolution of the state preparation of the first qudit.

20. The computer system of claim 19, wherein the first qudit is a first qubit.

21. The computer system of claim 19, wherein
- in the sending (A), the gates in the first set of gates for preparing the first qudit into the predetermined basis state are twirled by randomized compiling, and the gates in the first set of gates that measure the first qudit are twirled by randomized compiling,
- in the sending (C), the gates in the second set of gates for measurement of the first qudit are twirled by randomized compiling,
- in the sending (E), the gates in the third set of gates for preparing the first qudit and the gates for measurement are twirled by randomized compiling,
- in the sending (G), the gates in the fourth set of gates for preparing the first qudit and the gates for measuring are twirled by randomized compiling,
- in the sending (I), the gates for measurement are twirled, and
- in the sending (K), the gates for measurement are twirled.

22. A computer system for determining whether a qudit location in a quantum system is contributing to a coherent noise of the quantum system, the computer system comprising:
- at least one processor; and
- a memory storing at least one program for execution by the at least one processor, the at least one program comprising instructions for:
  - running circuit $Q^{j,T}$ with randomized compiling for both qudit location j and a plurality of qudit locations T within the quantum system, wherein qudit location j and the plurality of qudit locations T collectively consist of the qudit locations within the quantum system that are susceptible to coherent noise, with an output distribution $X^{j,T}$;
  - running the circuit $Q^T$ wherein the qudit location j is not twirled but the plurality of qudit locations T are twirled, with output distribution $X^T$;
  - computing the fidelity $F^{j,T}$ between $X^T$ and $X^{j,T}$ thereby setting a baseline of comparison for a difference twirling makes on the noise in qudit location j in isolation;
  - running the circuit $Q^j$ using randomized compiling on location j but on no other qudit within the quantum system with output distribution $X^j$;
  - computing the fidelity $F^j$ between $X^j$ and $X^T$;
  - running the circuit Q without any randomized compiling with output distribution X;
  - computing the fidelity F between X and $X^T$; and
  - determining, when $F^j - F$ is greater than $1 - F^{j,T}$, that qudit location j is contributing coherent noise to the quantum system.

* * * * *